(12) United States Patent
Takechi

(10) Patent No.: US 10,439,069 B2
(45) Date of Patent: Oct. 8, 2019

(54) OPTICAL SENSOR ELEMENT AND PHOTOELECTRIC CONVERSION DEVICE

(71) Applicant: NLT Technologies, Ltd., Kanagawa (JP)

(72) Inventor: Kazushige Takechi, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 176 days.

(21) Appl. No.: 15/227,107

(22) Filed: Aug. 3, 2016

(65) Prior Publication Data
US 2017/0047449 A1 Feb. 16, 2017

(30) Foreign Application Priority Data

Aug. 10, 2015 (JP) ................................. 2015-158120
Apr. 6, 2016 (JP) ................................. 2016-076755

(51) Int. Cl.
*H01L 27/146* (2006.01)
*H01L 29/786* (2006.01)
(Continued)

(52) U.S. Cl.
CPC ........... *H01L 29/7869* (2013.01); *G01J 1/44* (2013.01); *H01L 27/14614* (2013.01); *H01L 27/14616* (2013.01); *H01L 27/14689* (2013.01); *H01L 29/66969* (2013.01); *H01L 29/868* (2013.01); *H01L 31/022466* (2013.01)

(58) Field of Classification Search
CPC ............. H01L 27/1225; H01L 27/1251; H01L 27/14612
See application file for complete search history.

(56) References Cited

U.S. PATENT DOCUMENTS

| 5,196,911 A * | 3/1993 | Wu .................... H01L 31/1136 257/53 |
| 2005/0179964 A1* | 8/2005 | Izumi ................ H01L 27/14609 358/483 |

(Continued)

FOREIGN PATENT DOCUMENTS

| CN | 103187302 | 7/2013 |
| JP | 05-235398 | 9/1993 |

(Continued)

OTHER PUBLICATIONS

Seung-eon Ahn et al., "Oxide based Photosensor Thin Film Transistor for Interactive Display", The Proceedings of AM-FPD 2013, The Japan Society of Applied Physics, Jul. 2013, p. 67-70.

(Continued)

*Primary Examiner* — Thanh Luu
(74) *Attorney, Agent, or Firm* — Young & Thompson

(57) ABSTRACT

Two gate electrodes are provided on upper and lower sides of an oxide semiconductor active layer through respective insulating films. In addition, a first read-out electrode and a second read-out electrode are provided on right and left sides of the oxide semiconductor active layer. In the optical sensor element, in a case where a voltage is applied to each gate electrode, a potential difference occurs between the first read-out electrode and the second read-out electrode, and intensity of irradiation light is detected based on a current that flows between the read-out electrodes.

19 Claims, 18 Drawing Sheets

(51) Int. Cl.
*H01L 31/0224* (2006.01)
*H01L 29/66* (2006.01)
*H01L 29/868* (2006.01)
*G01J 1/44* (2006.01)

(56) References Cited

U.S. PATENT DOCUMENTS

| | | |
|---|---|---|
| 2006/0108529 A1 | 5/2006 | Saito et al. |
| 2010/0134735 A1 | 6/2010 | Nakamura et al. |
| 2012/0074474 A1* | 3/2012 | Kitagawa .......... H01L 27/14612 257/291 |
| 2013/0146866 A1 | 6/2013 | Kitagawa et al. |
| 2013/0169351 A1 | 7/2013 | Chang et al. |
| 2015/0123084 A1* | 5/2015 | Kim ...................... H01L 27/326 257/40 |
| 2016/0358956 A1* | 12/2016 | Chang ............... H01L 27/14612 |

FOREIGN PATENT DOCUMENTS

| | | |
|---|---|---|
| JP | 2006-165530 | 6/2006 |
| JP | 2010-153834 | 7/2010 |
| WO | WO2011-135920 | 11/2011 |

OTHER PUBLICATIONS

Masashi Tsubuku et al., "Photo-Current Response and Negative Bias Stability Under Light Irradiation in IGZO-TFT", Proceedings of the 17th international Display Workshops 2010 (IDW2010), The ITE Transactions on Media Technology and Applications (MTA), Dec. 2010, vol. 3, p. 1841-1844.

Chinese Office Action for Application No. 201610621913.4, dated Dec. 29, 2018, with English translation provided.

* cited by examiner

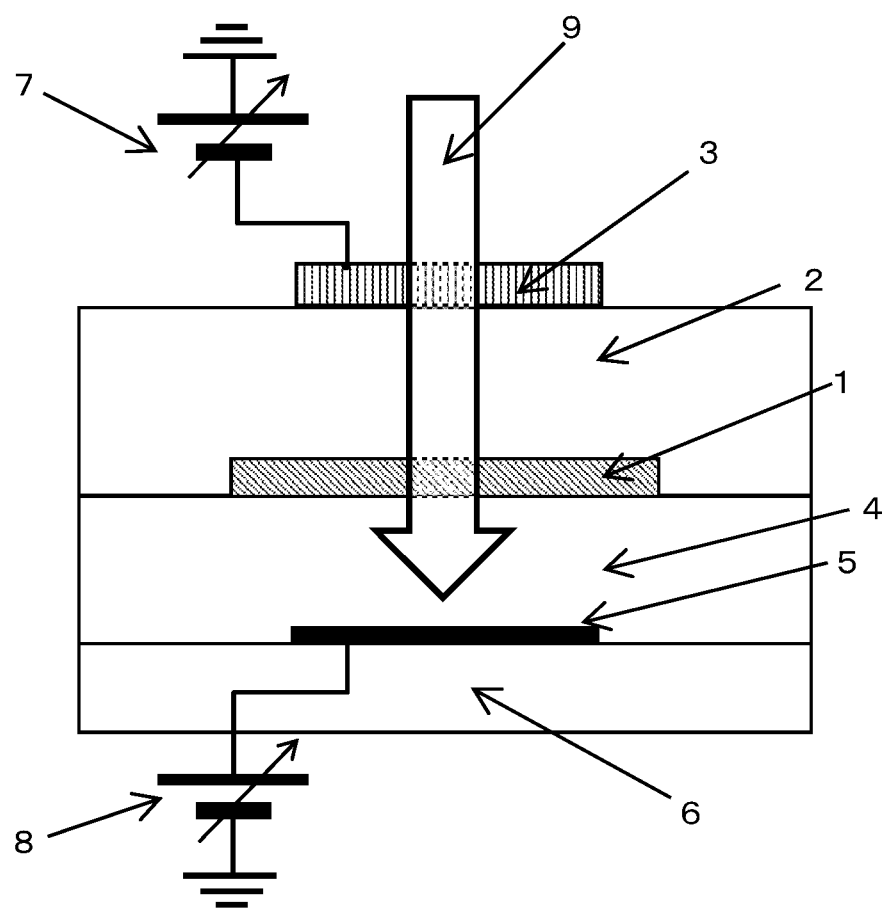
F I G. 1

BROKEN LINES: DARK STATE
SOLID LINES: 400nm LIGHT IRRADIATION STATE

F I G. 4 A
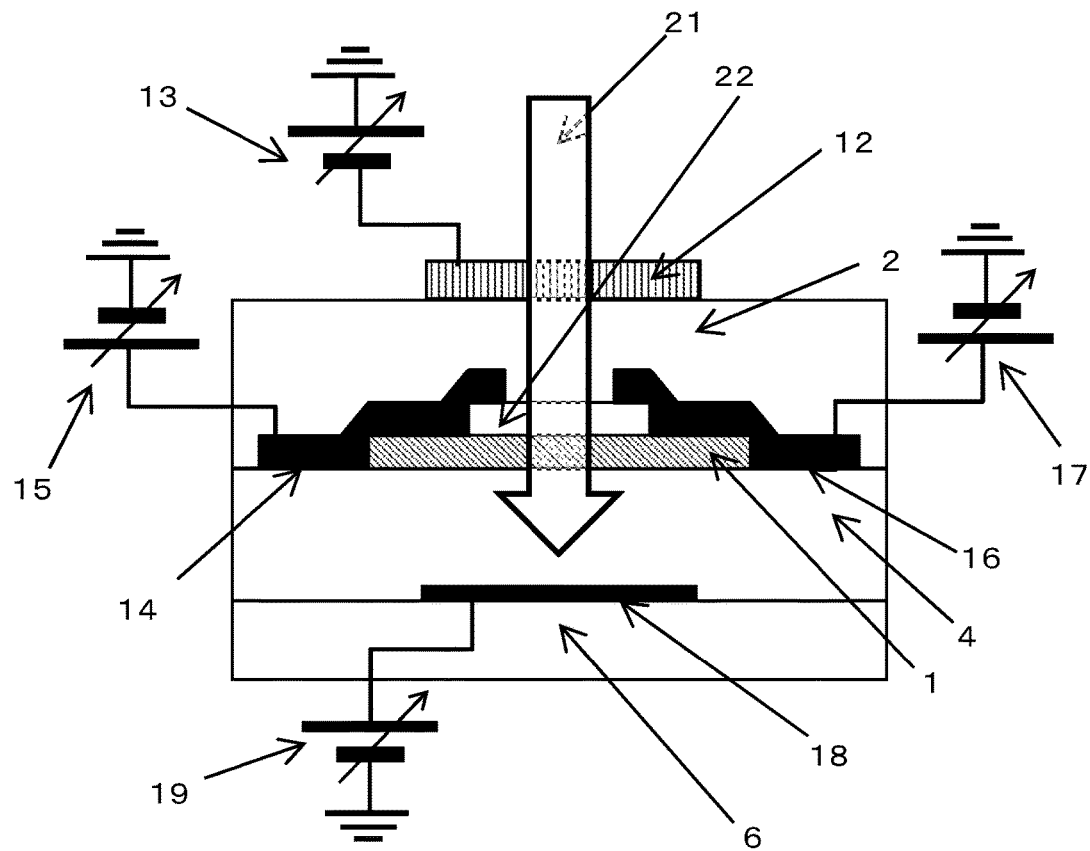
F I G. 4 B
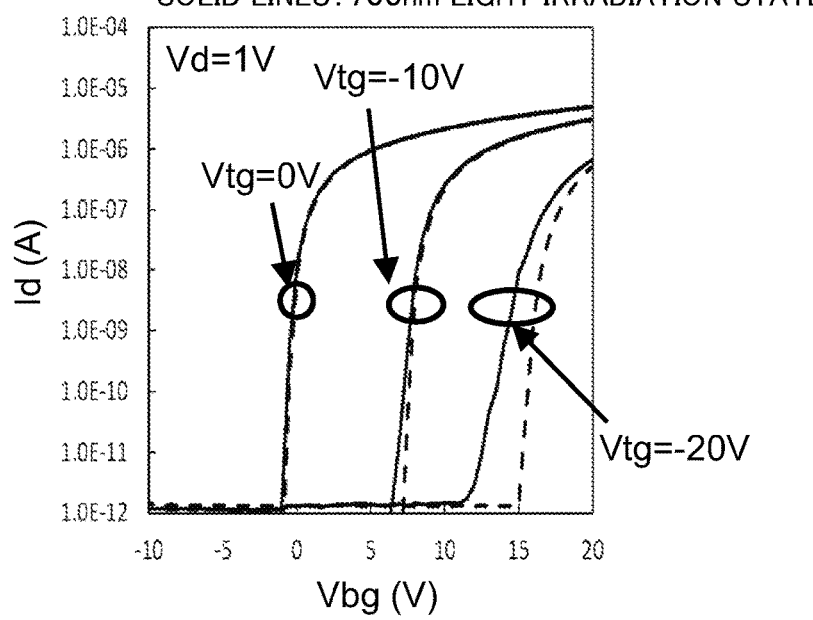

OPTICAL SENSOR ELEMENT AND PHOTOELECTRIC CONVERSION DEVICE

CROSS-REFERENCE TO RELATED APPLICATIONS

This Non-provisional application claims priority under 35 U.S.C. § 119(a) on Patent Application No. 2015-158120 filed in Japan on Aug. 10, 2015, and Patent Application No. 2016-76755 filed in Japan on Apr. 6, 2016, the entire contents of which are hereby incorporated by reference.

FIELD

The disclosure relates to an optical sensor element that uses an oxide semiconductor thin film element that is formed on a substrate, and particularly, to an optical sensor element that uses a dual gate type oxide semiconductor thin film element including respective gate electrodes on both upper and lower sides of an oxide semiconductor thin film, and a photoelectric conversion device.

BACKGROUND

Development of a photoelectric conversion device in which a thin film transistor (TFT) and a PIN diode (PIN type diode) are combined has been in progress. As the PIN diode that functions as an optical sensor, a PIN diode, in which three layers of P-type amorphous silicon that is doped with boron (element symbol: B) as an impurity, high-resistance amorphous silicon that is not doped with an impurity, and N-type amorphous silicon that is doped with phosphorous (element symbol: P) as an impurity are stacked, has been used. Band-gap energy of the amorphous silicon, which constitutes the PIN diode, is approximately 1.6 eV, and is sufficiently smaller than optical energy in a visible light region (wavelength: 400 nm (3.2 eV) to 700 nm (1.8 eV)). Accordingly, the optical sensor that uses the PIN diode absorbs almost all of light beams with wavelengths in the visible light region, and generates a carrier. As a result, the optical sensor functions as a photoelectric conversion element with efficiency.

Recently, a high-performance photoelectric conversion device, in which an oxide semiconductor TFT with high electric field effect mobility, and a PIN diode are combined, has been actively developed. When using the oxide semiconductor TFT as a switch or an amplification circuit, it is possible to extract a light intensity distribution after conversion into an electrical signal with excellent reproducibility, and it is possible to reduce an area occupied by the amplification circuit.

As described above, there are disclosed various technologies relating to the photoelectric conversion device in which the switch that uses the oxide semiconductor TFT, and the optical sensor that includes the PIN diode or the amorphous silicon TFT are combined.

For example, WO2011/135920 (hereinafter, referred to as Patent Document 1) discloses a photoelectric conversion device in which a switch constituted by a top gate-type oxide semiconductor TFT with a high ON/OFF ratio, and an optical sensor constituted by a bottom gate-type amorphous silicon TFT with high light sensitivity are combined. In a technology disclosed in Patent Document 1, it is possible to connect a gate line and a drain line without forming a contact hole due to the combination of the top gate type and the bottom gate type, and thus it is possible to reduce a photolithography process.

In addition, Japanese Patent Application Publication No. 2010-153834 (hereinafter, referred to as Patent Document 2) discloses a high-performance photoelectric conversion device in which an oxide semiconductor TFT (that constitutes a switch and an amplification circuit) with high electric field effect mobility, and a PIN diode are combined. In a technology disclosed in Patent Document 2, the oxide semiconductor TFT is used, and thus it is possible to extract a light intensity distribution after conversion into an electric signal with excellent reproducibility. In addition, it is possible to reduce an area occupied by the amplification circuit.

In addition, Japanese Patent Application Publication No. 2006-165530 (hereinafter, referred to as Patent Document 3) discloses a technology in which a pigment is adsorbed to an oxide semiconductor in order for the oxide semiconductor to have visible light sensitivity, and the oxide semiconductor is used in an optical sensor or an X-ray sensor as a photodiode of two-terminal element.

In addition, in Japanese Patent Application Publication No. H5-235398 (hereinafter, referred to as Patent Document 4), with regard to an optical sensor that is constituted by amorphous silicon TFT, a structure, in which a top gate electrode formed of a transparent material is added, is disclosed. In a technology disclosed in Patent Document 4, a potential of the top gate electrode is fixed to a potential that is lower than a potential of a source electrode, and a threshold voltage is shifted to a positive direction so as to reduce a dark current when a gate voltage is 0 V. According to this, a high bright-dark current ratio is realized.

In addition, in "Oxide based Photosensor Thin Film Transistor for Interactive Display" by Seung-eon Ahn and seven persons, The Proceedings of AM-FPD 2013, The Japan Society of Applied Physics, July 2013, p. 67-70 (hereinafter, referred to as Non-Patent Document 1), a technology, in which the oxide semiconductor TFT is used in both a switch and an optical sensor, is disclosed. In addition, in Non-Patent Document 1, a shied for light shielding is provided on an upper portion of the oxide semiconductor TFT for the switch, but the shield is not provided on an upper portion of the oxide semiconductor TFT for the optical sensor. In a technology disclosed in Non-Patent Document 1, optical sensing is performed by using a phenomenon in which an off-current in the oxide semiconductor TFT for the optical sensor increases in the case of performing irradiation with light beams of green to bluish-purple, which have a wavelength of 550 nm or less.

SUMMARY

However, in the technology disclosed in Patent Document 1 or Patent Document 2, the TFT for the switch is an oxide semiconductor, and the optical sensor is formed with amorphous silicon TFT or a PIN diode, and thus a separate formation process is necessary. Therefore, there is a problem of high cost or a decrease in yield ratio. In addition, particularly, electrical characteristics of silicon vary depending on an ambient temperature, and thus there is a problem that the performance of the photoelectric conversion device varies depending on an environmental temperature. Even in the technology disclosed in Patent Document 4, since the amorphous silicon TFT is used, it is difficult to avoid a problem that performance varies depending on an environmental temperature due to material-specific physical properties that electrical conductivity of silicon has great temperature dependency.

In addition, in the technology disclosed in Patent Document 3, both a switch unit and an optical sensor unit are formed by using an oxide semiconductor. However, a pigment is adsorbed to the oxide semiconductor of the sensor unit in order for the oxide semiconductor to have visible light sensitivity, thereby providing a light sensitivity function. In a case where an organic material as described above is mixed in, the organic material becomes a contamination source in the oxide semiconductor TFT of the switch unit in which the pigment is not originally necessary, and thus there is a problem that reliability or a yield ratio decreases.

In the technology disclosed in Non-Patent Document 1, the optical sensor, which uses the oxide semiconductor TFT, does not have sensitivity with respect to red light having a wavelength of 600 nm or greater, and thus there is a problem that the optical sensor does not function as an optical sensor that functions over the entirety of a visible light region. In addition, the light sensitivity with respect to light beams from blue to green is uniquely determined in accordance with characteristics of the oxide semiconductor TFT, and thus there is a problem that control from an outer side is difficult.

An optical sensor element according to an aspect of the disclosure comprises: gate electrodes disposed on an upper side and a lower side of an oxide semiconductor active layer through respective insulating films; and a voltage application unit that applies a first voltage to one of the gate electrodes and applies a second voltage to the other of the gate electrodes.

It is to be understood that both the foregoing general description and the following detailed description are exemplary and explanatory and are not restrictive of this disclosure.

BRIEF DESCRIPTION OF THE DRAWINGS

FIG. 1 is a cross-sectional view of an optical sensor according to a first embodiment;
FIGS. 4A and 4B are diagrams illustrating an optical sensor according to a third embodiment.

DETAILED DESCRIPTION

Figure 2:
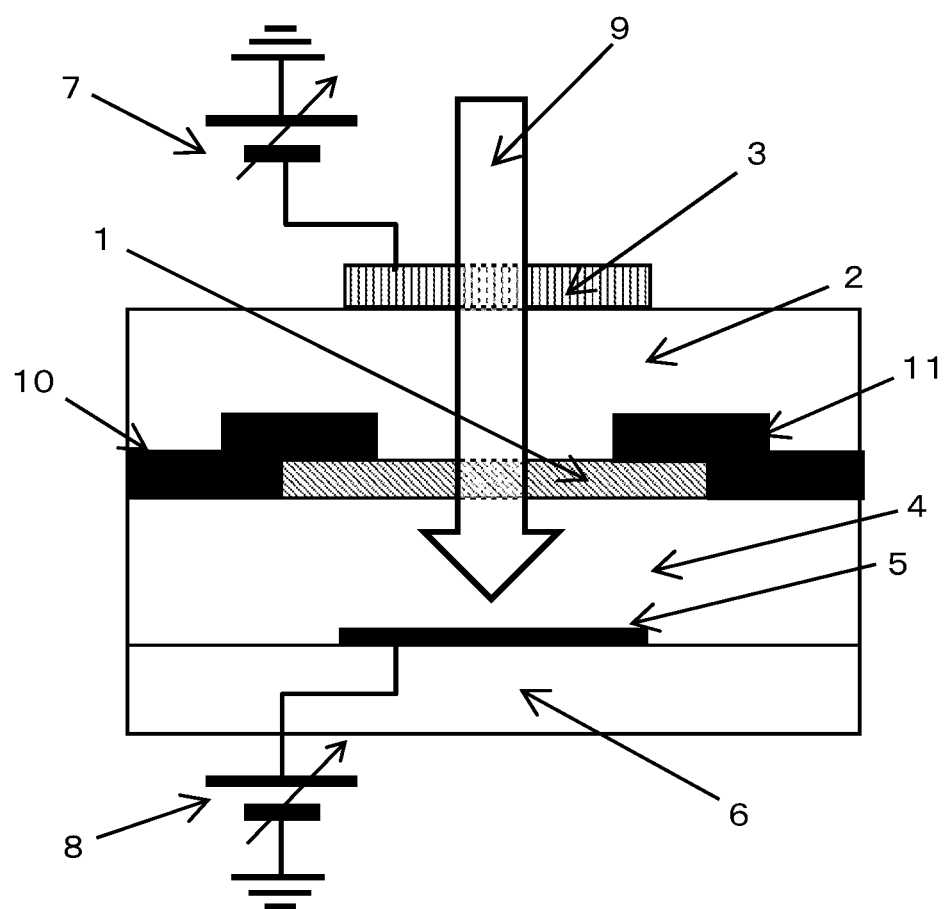
FIG. 2 is a cross-sectional view of an optical sensor according to Example 1 of the first embodiment.

Hereinafter, embodiments of the disclosure will be described with reference to the drawings.

First Embodiment

FIG. 1 is a cross-sectional view of an optical sensor according to a first embodiment. The optical sensor according to the first embodiment is formed by using an oxide semiconductor. In the optical sensor (optical sensor element) of the first embodiment, the following structure is formed on a glass substrate 6. In the structure, a first insulating film (insulating film) 2 and a first conductive electrode (gate electrode) 3 formed of a material that is transparent to visible light are provided on one side of an oxide semiconductor film (oxide semiconductor active layer) 1, and a second insulating film (insulating film) 4 and a second conductive electrode (gate electrode) 5 are provided on the other side of the oxide semiconductor film 1. As an element that constitutes the oxide semiconductor film 1, at least indium or zinc is contained. In an example illustrated in FIG. 1, the first conductive electrode 3 on an upper side of the oxide semiconductor film 1 is constituted by a transparent material. However, the second conductive electrode 5 on a lower side of the oxide semiconductor film 1 may be constituted by a transparent material, and both of the first conductive electrode 3 and the second conductive electrode 5 may be constituted by a transparent material. That is, at least one of the two conductive electrodes 3 and 5 may be formed of a transparent material in order for light to be incident to the oxide semiconductor film 1.

In the structure illustrated in FIG. 1, a first potential 7 is applied to the first conductive electrode 3 that is formed of a transparent material, a second potential 8 is applied to the second conductive electrode 5, and the oxide semiconductor film 1 is irradiated with light 9 from a first conductive electrode 3 side in a state in which a potential gradient in a film thickness direction of the oxide semiconductor film 1 is made to be large. At this time, even in a case where the oxide semiconductor film 1 is irradiated with light having a wavelength with energy that is equal to or greater than band-gap energy (typically, 3.0 eV to 3.5 eV) of the oxide semiconductor film 1 and light (for example, red light having a wavelength of 600 nm to 800 nm) having a wavelength with energy that is less than the band-gap energy, a photocarrier that contributes to conduction is generated in the oxide semiconductor film 1 due to the potential gradient in the oxide semiconductor film 1. In a technology of the related art as disclosed in Non-Patent Document 1, it is not possible to generate the photocarrier in the oxide semiconductor film 1 by irradiating the oxide semiconductor film 1 with red light, but the photocarrier can be generated in an optical sensor that uses the oxide semiconductor as illustrated in FIG. 1.

Typically, it is known that an energy level, which is caused by oxygen vacancy, is present in a band-gap of an oxide semiconductor. In a case where the oxide semiconductor film 1 is irradiated with light having energy that is less than a band-gap energy, an electron is excited to the energy level, and is tunneled from the energy level to a conduction band due to the potential gradient in the oxide semiconductor film 1 and functions as a carrier. This is a physical mechanism in which a photocarrier is generated in the oxide semiconductor film 1 even when being irradiated with light having a wavelength with energy less than the band-gap energy, and the mechanism is realized first by the disclosure.

Example 1

Hereinafter, description will be given of Example 1 related to an optical sensor that is formed by using an oxide semiconductor of the first embodiment. As described above, the optical sensor functions by reading out the photocarrier, which is generated in the oxide semiconductor film 1, as a current signal or a voltage signal. FIG. 2 is a cross-sectional view of the optical sensor according to Example 1 of the first embodiment. FIG. 2 illustrates a structure in which a first read-out electrode 10 and a second read-out electrode 11 are added to the optical sensor illustrated in FIG. 1 on each of right and left sides of the oxide semiconductor film 1. The photocarrier, which is generated, is read out as a current signal or a voltage signal by using the electrodes 10 and 11. According to this, irradiation light intensity can be sensed.

In the optical sensor of Example 1, an InGaZnO film, which includes indium (element symbol: In), gallium (element symbol: Ga), zinc (element symbol: Zn), and oxygen (element symbol: O), is used as the oxide semiconductor film 1. In addition, a silicon oxide film is used as the first insulating film 2 and the second insulating film 4, an indium tin oxide (ITO) film is used as the first conductive electrode 3, and an electrode formed of an aluminum alloy is used as the second conductive electrode 5. Accordingly, in Example 1, the silicon oxide film that is the first insulating film 2 is formed on an upper side of the InGaZnO film that is the oxide semiconductor film 1, and the ITO film that is the first conductive electrode 3 is further formed on an upper side thereof. In addition, the silicon oxide film that is the second insulating film 4, and the second conductive electrode 5 formed of an aluminum alloy are formed on a lower side of the InGaZnO film. As described above, the oxide semiconductor film 1, in which the first insulating film 2, the first conductive electrode 3, the second insulating film 4, and the second conductive electrode 5 are formed, is formed on an upper surface of the glass substrate 6 in a state in which the second conductive electrode 5 is set as a lower side. In addition, the read-out electrodes 10 and 11, which are formed of a molybdenum alloy, are respectively formed on the right and left ends of the InGaZnO film (the oxide semiconductor film 1). The optical sensor of Example 1 includes a mechanism (voltage application unit) that applies the first potential 7 to the first conductive electrode 3, and applies the second potential 8 to the second conductive electrode 5.

Next, description will be given of a method of manufacturing the optical sensor of Example 1.

First, an aluminum alloy film is formed on the glass substrate 6 in accordance with a sputtering method, and is patterned into a predetermined shape so as to form the second conductive electrode 5. Then, the second insulating film 4 (silicon oxide film) is formed at a temperature of 350° C. in accordance with a plasma chemical vapor deposition (CVD) method in which a mixed gas of $SiH_4$ (silane, silicon hydride) and $N_2O$ (dinitrogen oxide) is used as a raw material. Then, the InGaZnO film is formed in accordance with the sputtering method, and is patterned into a desired island shape through etching so as to form the oxide semiconductor film 1. Including In:Ga:Zn:O=1:1:1:4, a composition ratio of the oxide semiconductor film 1 may be designed in an arbitrary manner on the basis of etching workability and the like.

After forming the oxide semiconductor film 1, an annealing treatment is performed in the air at a temperature of 350° C. to 500° C. for one hour. Then, a molybdenum alloy film is formed in accordance with the sputtering method, and is patterned into a predetermined shape to form the first read-out electrode 10 and the second read-out electrode 11.

In addition, the first insulating film 2 (silicon oxide film) is formed at a temperature of 200° C. in accordance with the plasma CVD method in which the mixed gas of $SiH_4$ and $N_2O$ is used as a raw material. After forming the first insulating film 2, an annealing treatment is performed at a temperature of 350° C. to 400° C. According to this, film quality of the silicon oxide film can be reformed. Then, an ITO film is formed in accordance with the sputtering method, and is patterned into a desired shape so as to form the first conductive electrode 3 formed of a transparent material.

In the optical sensor that is configured as described above, the first potential 7 is applied to the first conductive electrode 3, and the second potential 8 is applied to the second conductive electrode 5 in order for a potential difference to occur between the read-out electrodes 10 and 11. At this time, the optical sensor functions by detecting light intensity dependency of a current that flows between the read-out electrodes 10 and 11. In addition, the oxide semiconductor film 1 has the following properties. That is, in a case where the first potential 7 is applied to one gate electrode (first conductive electrode 3) and the second potential 8 is applied to the other gate electrode (second conductive electrode 5), the amount of visible-light absorbed by the oxide semiconductor film 1 increases in comparison to non-voltage application (a case where a voltage is not applied).

In the optical sensor of Example 1, a conductive electrode (3 or 5), to which a lower potential among the first potential 7 and the second potential 8 is applied, may be constituted by a transparent material, and irradiation with light 9 may be performed from a side of the conductive electrode (3 or 5) formed of the transparent material.

As the oxide semiconductor film 1, in addition to the above-described InGaZnO film, a ZnO film, an InZnO film, an InSnZnO film, an InAlZnO film, and the like can be used. A method of forming these films is not limited to the sputtering method, and a pulse laser film formation method, a coating and baking method in which a liquid material is used, and the like may be used.

As the first insulating film 2 and the second insulating film 4, in addition to the above-described silicon oxide film, a silicon nitride film, an aluminum oxide film, a tantalum oxide film, or a stacked body in which a plurality of the films are stacked may be used. A method of forming the films is not limited to the plasma CVD method, and a sputtering method, a vapor deposition method, an atomic layer deposition (ALD) method, and the like may be also used.

Second Embodiment

Figure 3A:
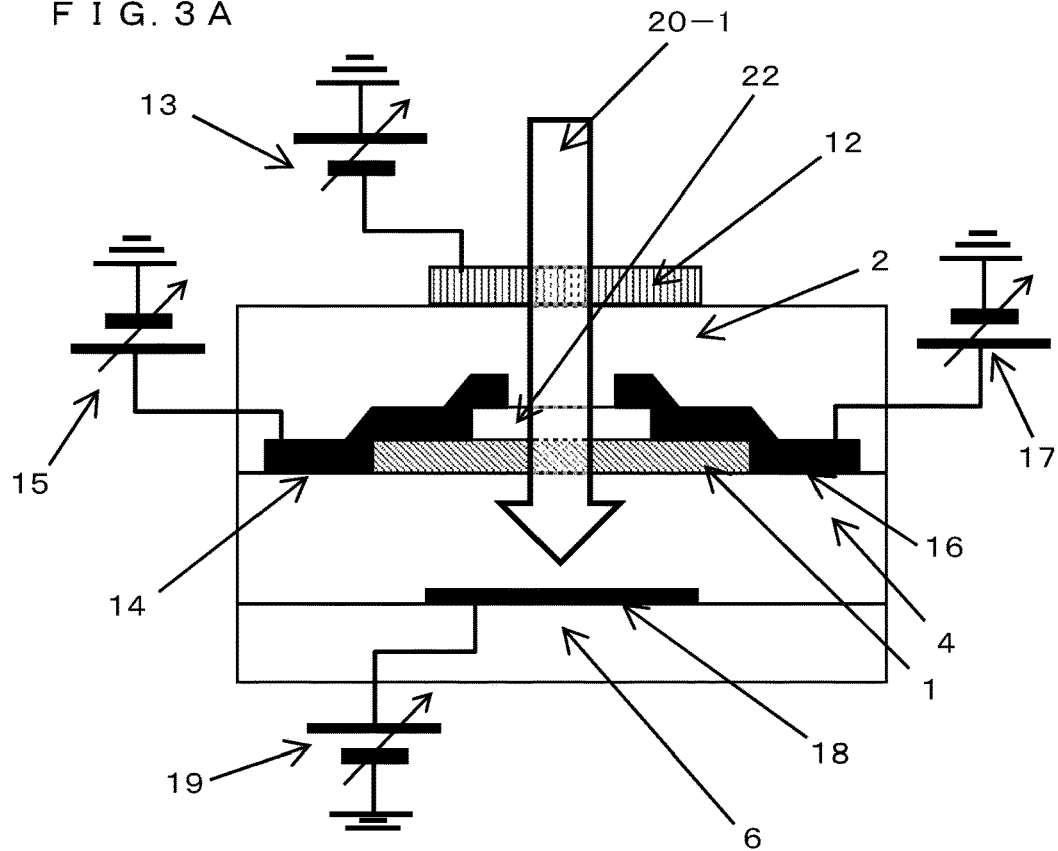
FIGS. 3A and 3B are diagrams illustrating an optical sensor according to a second embodiment.
Figure 3B:
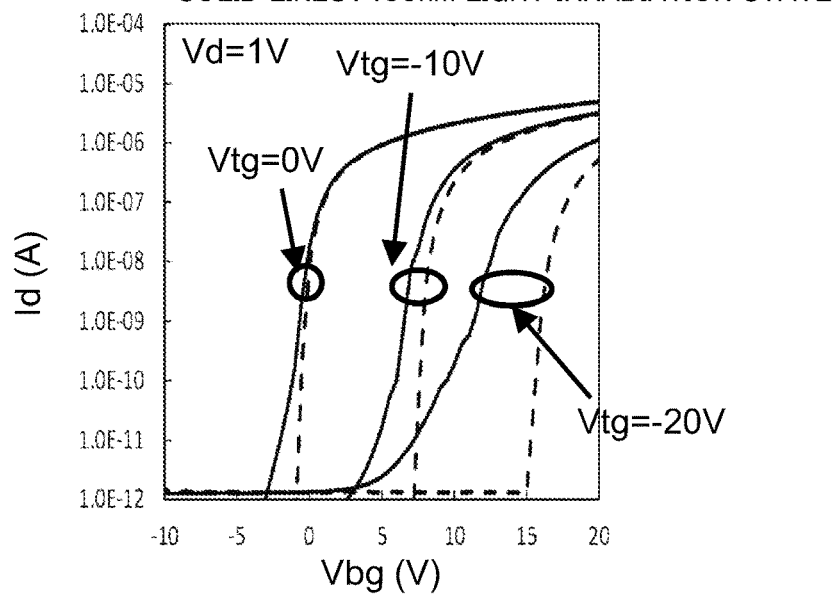

FIGS. 3A and 3B are diagrams illustrating an optical sensor according to a second embodiment. FIG. 3A is a cross-sectional view of the optical sensor according to the second embodiment, and FIG. 3B is a graph illustrating optical sensing characteristics in a case where the optical sensor according to the second embodiment is irradiated with light having a wavelength of 400 nm±10 nm. The optical sensor according to the second embodiment is formed by using a dual gate type oxide semiconductor TFT.

In the optical sensor of the second embodiment, a protective insulating film 22 and a first insulating film (insulating film, first gate insulating film) 2 are formed on an upper side of an oxide semiconductor film (oxide semiconductor active layer) 1, and a transparent top gate electrode (gate electrode, first gate electrode) 12 that is transparent with respect to visible light is further formed on an upper side thereof. In addition, a second insulating film (insulating film, second gate insulating film) 4 and a bottom gate electrode (gate electrode, second gate electrode) 18 are formed on a lower side of the oxide semiconductor film 1. The oxide semiconductor film 1, in which the respective films and the respective electrodes are formed on upper and lower sides thereof, is formed on a glass substrate 6 in a state in which the bottom gate electrode 18 is set as a lower side. In addition, a source electrode 14 is formed to come into contact with a left end of the oxide semiconductor film 1 and a left end of the protective insulating film 22, and a drain electrode 16 is formed to come into contact with a right end of the oxide semiconductor film 1 and a right end of the protective insulating film 22. A material of the oxide semiconductor film 1 is the same as in the first embodiment.

In the optical sensor illustrated in FIG. 3A, blue light 20-1 (for example, light having a wavelength of 400 nm±10 nm) is incident to the oxide semiconductor film 1 from a transparent top gate electrode 12 side. At this time, a transparent top gate electrode potential 13, which is applied to the transparent top gate electrode 12, is set to be lower than a source electrode potential 15 that is applied to the source electrode 14. In addition, a drain electrode potential 17, which is applied to the drain electrode 16, is set to be higher than the source electrode potential 15, and a bottom gate electrode potential 19, which is applied to the bottom gate electrode 18, is set to be higher than the source electrode potential 15.

FIG. 3B illustrates characteristics (Vbg-Id characteristics) of a drain current (Id) with respect to the bottom gate electrode potential 19 (Vbg) when the drain electrode potential 17 (Vd) is set to 1 V and the source electrode potential 15 (Vs) is set to 0 V. In addition, FIG. 3B illustrates Vbg-Id characteristics in a case where the transparent top gate electrode potential 13 (Vtg) is set as a parameter, and Vtg is set to 0 V, −10 V, and −20 V. Broken lines in FIG. 3B represent characteristics in a state (dark state) in which irradiation with light is not performed, and solid lines represent characteristics in a state (light irradiation state) in which irradiation with light having a wavelength of 400 nm±10 nm is performed. In addition, irradiation with monochromatic light (a band width is center wavelength±10 nm), which is generated by a halogen light source (halogen lamp unit AT-100HG, manufactured by SHIMADZU CORPORATION) and a spectrometer (spectrometer SPG-120S, manufactured by SHIMADZU CORPORATION), is performed from the transparent top gate electrode 12 side by using fiber.

As can be seen from FIG. 3B, as the transparent top gate electrode potential 13 (Vtg) is set to be lower than the source electrode potential 15 (Vs=0 V), a sub-threshold current (current in a transition state from OFF to ON) in the characteristics in the light irradiation state becomes greater in comparison to the characteristics in the dark state. In addition, even in an operation state, the bottom gate electrode potential 19 (Vbg) is set to be higher than the source electrode potential 15 (Vs). FIG. 3B illustrates that as the transparent top gate electrode potential 13 (Vtg) is set to be lower, light sensitivity of a dual gate type oxide semiconductor TFT becomes higher. This is caused by the following phenomenon. Specifically, in a case where a first voltage is applied to one gate electrode and a second voltage is applied to the other gate electrode, the amount of visible light absorbed in the oxide semiconductor film 1 increases in comparison to non-voltage application (a case where a voltage is not applied). In the second embodiment, the transparent top gate electrode potential 13 (Vtg) is set to be lower than the source electrode potential 15 (Vs) as described above so as to amplify the light sensitivity of the oxide semiconductor TFT, thereby utilizing the oxide semiconductor TFT as an optical sensor. Furthermore, a light sensitivity function can be controlled in an arbitrary manner by appropriately controlling a value of the transparent top gate electrode potential 13 (Vtg). Accordingly, in the optical sensor element constituted by using the oxide semiconductor, the light sensitivity function can be controlled and the light sensitivity over the entirety of a visible light region can be achieved.

Example 2

Hereinafter, description will be given of Example 2 related to an optical sensor that is formed by using the dual gate type oxide semiconductor TFT of the second embodiment.

In the optical sensor of Example 2, as is the case with the first embodiment, the InGaZnO film is used as the oxide semiconductor film 1. In addition, a silicon oxide film is used as the protective insulating film 22, the first insulating film 2, and the second insulating film 4, an ITO film is used as the transparent top gate electrode 12, and an electrode formed of an aluminum alloy is used as the bottom gate electrode 18. In addition, an electrode, in which a molybdenum alloy film and an aluminum alloy film are stacked, is used as the source electrode 14 and the drain electrode 16.

In Example 2, silicon oxide films, which are the protective insulating film 22 and the first insulating film 2 and are formed of a silicon oxide, are formed on an upper side of the InGaZnO film that is the oxide semiconductor film 1, and an ITO film that is the transparent top gate electrode 12 is further formed on an upper side thereof. In addition, a silicon oxide film that is the second insulating film 4, and the bottom gate electrode 18 formed of an aluminum alloy are formed on a lower side of the InGaZnO film. The oxide semiconductor film 1 formed as described above is formed on an upper surface of the glass substrate 6 in a state in which the bottom gate electrode 18 is set as a lower side. In addition, the source electrode 14 and the drain electrode 16 are formed on right and left ends of the InGaZnO film (oxide semiconductor film 1). The source electrode 14 is formed in a region that overlaps a part of a left end of the protective insulating film 22 and comes into direct contact with a left end side of the oxide semiconductor film 1. The drain electrode 16 is formed in a region that overlaps a part of a right end of the protective insulating film 22 and comes into direct contact with a right end side of the oxide semiconductor film 1. The source electrode 14 and the drain electrode 16 have a configuration in which a molybdenum alloy film and an aluminum alloy film are stacked, and are disposed in such a manner that the molybdenum alloy film comes into contact with the oxide semiconductor film 1.

The optical sensor of Example 2 includes a mechanism that applies the transparent top gate electrode potential 13 to the transparent top gate electrode 12, applies the source electrode potential 15 to the source electrode 14, applies the drain electrode potential 17 to the drain electrode 16, and applies the bottom gate electrode potential 19 to the bottom gate electrode 18. In addition, the optical sensor of Example 2 includes a mechanism (voltage application unit) that applies the transparent top gate electrode potential 13, which is lower than the source electrode potential 15, to the transparent top gate electrode 12, and a mechanism that applies the drain electrode potential 17, which is higher than the source electrode potential 15, to the drain electrode 16. In addition, the optical sensor of Example 2 includes a mechanism (voltage application unit) that applies the bottom gate electrode potential 19, which is higher than the source electrode potential 15, to the bottom gate electrode 18. The optical sensor configured as described above includes a mechanism that introduces blue light 20-1 into the oxide semiconductor film 1 from the transparent top gate electrode 12 side.

Next, description will be given of a method of manufacturing the optical sensor of Example 2.

First, an aluminum alloy film is formed on the glass substrate 6 in accordance with a sputtering method, and is patterned into a predetermined shape so as to form the bottom gate electrode 18. Then, the second insulating film 4 (silicon oxide film) is formed in a film thickness of 400 nm at a temperature of 350° C. in accordance with a plasma CVD method in which a mixed gas of tetraethyl orthosilicate (TEOS) and oxygen ($O_2$) is used as a raw material. Then, an InGaZnO film is formed in a film thickness of 50 nm in accordance with a sputtering method, and is patterned into a desired island shape through etching so as to form the oxide semiconductor film 1. As a composition ratio of the oxide semiconductor film 1, In:Ga:Zn:O=1:1:1:4 can be used.

After forming the oxide semiconductor film 1, an annealing treatment is performed in the air at a temperature of 400° C. for one hour. Then, a silicon oxide film is formed in a film thickness of 100 nm at a temperature of 200° C. in accordance with a plasma CVD method in which a mixed gas of $SiH_4$ and $N_2O$ is used as a raw material, and is patterned into a desired shape so as to form the protective insulating film 22. Then, a molybdenum alloy film and an aluminum alloy film are formed in this order in accordance with a sputtering method, and are patterned into a desired shape so as to form the source electrode 14 and the drain electrode 16.

Then, the first insulating film 2 (silicon oxide film) is formed in a film thickness of 300 nm at a temperature of 200° C. in accordance with a plasma CVD method in which a mixed gas of $SiH_4$ and $N_2O$ is used as a raw material. After forming the first insulating film 2, an annealing treatment may be performed at a temperature of 300° C. to 400° C. so as to reform the protective insulating film 22 and the first insulating film 2 which are formed at a temperature of 200° C. Then, an ITO film is formed in accordance with a sputtering method, and is patterned into a desired shape so as to form the transparent top gate electrode 12.

In the optical sensor configured as described above, the oxide semiconductor film 1 was irradiated with bluish-purple light having a wavelength of 400 nm±10 nm from the transparent top gate electrode 12 side. Energy density of the irradiation light is 78 µW/cm². At this time, the transparent top gate electrode potential 13 (Vtg) is set to be lower than the source electrode potential 15 (Vs), and the drain electrode potential 17 (Vd) and the bottom gate electrode potential 19 (Vbg) are set to be higher than the source electrode potential 15 (Vs).

As can be seen from FIG. 3B, in a case where Vtg is set to −10 V or −20 V, that is, a positive potential is applied to the bottom gate electrode potential 19 (Vbg) in a state of Vtg<Vs (Vs=0 V), a sub-threshold current further increased during irradiation with the bluish-purple light in comparison to a dark state, and high light sensitivity was achieved. In addition, in a method in which Vtg is set to −20 V, a difference between characteristics in a dark state and characteristics in a light irradiation state becomes greater in comparison to a case where Vtg is set to −10 V, and this represents that the light sensitivity can be controlled by changing a value of Vtg. In addition, even when Vtg is set to 0 V, slight light sensitivity is provided. However, since energy of light having a wavelength of 400 nm is approximately the same as band-gap energy of the InGaZnO film, the slight light sensitivity is caused by direct excitation of an electron to a conduction band. As described above, the aspect capable of controlling the light sensitivity of the oxide semiconductor TFT by changing the value of the transparent top gate electrode potential 13 (Vtg) is one of effects of the disclosure. It is possible to utilize the oxide semiconductor TFT as an optical sensor by amplifying the light sensitivity of the oxide semiconductor TFT by utilizing the effect.

Third Embodiment

FIGS. 4A and 4B are diagrams illustrating an optical sensor according to a third embodiment. FIG. 4A is a cross-sectional view of the optical sensor according to the third embodiment, and FIG. 4B is a graph illustrating optical sensing characteristics in the case of irradiating the optical sensor according to the third embodiment with light having a wavelength of 700 nm±10 nm. The optical sensor according to the third embodiment is formed by using a dual gate type oxide semiconductor TFT.

The optical sensor of the third embodiment has the same structure as that of the optical sensor of the second embodiment. In the optical sensor of the third embodiment, red light 21 (for example, light having a wavelength of 700 nm±10 nm) is incident to the oxide semiconductor film 1 from a side of the transparent top gate electrode 12 that is transparent with respect to visible light. At this time, the transparent top gate electrode potential 13 is set to be lower than the source electrode potential 15, the drain electrode potential 17 is set to be higher than the source electrode potential 15, and the bottom gate electrode potential 19 is set to be higher than the source electrode potential 15.

FIG. 4B illustrates characteristics (Vbg-Id characteristics) of a drain current (Id) with respect to the bottom gate electrode potential 19 (Vbg) when the drain electrode potential 17 (Vd) is set to 1 V and the source electrode potential 15 (Vs) is set to 0 V. In addition, FIG. 4B illustrates Vbg-Id characteristics in a case where the transparent top gate electrode potential 13 (Vtg) is set as a parameter, and Vtg is set to 0 V, −10 V, and −20 V. Broken lines in FIG. 4B represent characteristics in a state (dark state) in which irradiation with light is not performed, and solid lines represent characteristics in a state (light irradiation state) in which irradiation with light having a wavelength of 700 nm±10 nm is performed. In addition, irradiation with monochromatic light (a band width is center wavelength±10 nm), which is generated by a halogen light source (halogen lamp unit AT-100HG, manufactured by SHIMADZU CORPORATION) and a spectrometer (spectrometer SPG-120S, manufactured by SHIMADZU CORPORATION), is performed from the transparent top gate electrode 12 side by using fiber.

As can be seen from FIG. 4B, in a case where the transparent top gate electrode potential 13 (Vtg) is set to be lower than the source electrode potential 15 (Vs=0 V), and particularly, Vtg is set to −20 V, a sub-threshold current in the characteristics in the light irradiation state becomes greater in comparison to the characteristics in the dark state. In addition, even in an operation state, the bottom gate electrode potential 19 (Vbg) is set to be higher than the source electrode potential 15 (Vs). This represents the following phenomenon. Specifically, as is case with the irradiation with blue light as described in the second embodiment, even in irradiation with red light, as the transparent top gate electrode potential 13 (Vtg) is set to be lower, the light sensitivity of the oxide semiconductor TFT becomes higher. Since typical band-gap energy of the oxide semiconductor is 3.0 eV to 3.5 eV, the result in FIG. 4B represents that it is possible to apply a light sensitivity function with respect to light with energy, which is significantly lower than the band-gap energy of the oxide semiconductor, to the oxide semiconductor TFT (energy of light having a wavelength of 700 nm is approximately 1.8 eV).

In a technology of the related art, an oxide semiconductor TFT, which has sensitivity for red light with energy less than the band-bap energy, does not present. This is disclosed in Non-Patent Document 1. In addition, data, in which the oxide semiconductor TFT does not have sensitivity with respect to light having a wavelength of 550 nm or greater, is also disclosed in "Photo-Current Response and Negative Bias Stability Under Light Irradiation in IGZO-TFT" by Masashi Tsubuku and eight persons, Proceedings of the 17th international Display Workshops 2010 (IDW2010), The Institute of Image Information and Television Engineers, December 2010, volume 3, p. 1841-1844.

In the third embodiment, as described above, the transparent top gate electrode potential 13 (Vtg) is set to be lower than the source electrode potential 15 (Vs) so as to apply the light sensitivity with respect to light with energy, which is lower than the band-gap energy, to the oxide semiconductor TFT. According to this, it is possible to utilize the oxide semiconductor TFT as an optical sensor over the entirety of a visible light region.

Example 3

Hereinafter, description will be given of Example 3 related to the optical sensor that is formed by using the dual gate type oxide semiconductor TFT of the third embodiment.

In the optical sensor of Example 3, as is the case with the second embodiment, an InGaZnO film is used as the oxide semiconductor film 1. In addition, a silicon oxide film is used as the protective insulating film 22 and the first insulating film 2, and an ITO film is used as the transparent top gate electrode 12, and an electrode formed of an aluminum alloy is used as the bottom gate electrode 18. In Example 3, a stacked film in which a silicon oxide film and a silicon nitride film are stacked is used as the second insulating film 4, and an electrode, in which three layers including a titanium film, an aluminum alloy film, and titanium film are stacked, is used as the source electrode 14 and the drain electrode 16.

In Example 3, silicon oxide films, which are the protective insulating film 22 and the first insulating film 2 and are formed of a silicon oxide, are formed on an upper side of the InGaZnO film that is the oxide semiconductor film 1, and an ITO film that is the transparent top gate electrode 12 is further formed on an upper side thereof. In addition, a stacked film which is the second insulating film 4 and in which a silicon oxide film and a silicon nitride film are stacked, and the bottom gate electrode 18 that is formed of an aluminum alloy are formed on a lower side of the InGaZnO film. The oxide semiconductor film 1 formed as described above is formed on an upper surface of the glass substrate 6 in a state in which the bottom gate electrode 18 is set as a lower side. In addition, the source electrode 14 and the drain electrode 16 are formed on the right and left ends of the InGaZnO film (oxide semiconductor film 1). The source electrode 14 is formed in a region that overlaps a part of a left end of the protective insulating film 22 and comes into direct contact with a left end side of the oxide semiconductor film 1. The drain electrode 16 is formed in a region that overlaps a part of a right end of the protective insulating film 22 and comes into direct contact with a right end side of the oxide semiconductor film 1. The source electrode 14 and the drain electrode 16 have a configuration in which a titanium film, an aluminum alloy film, and a titanium film are stacked, and are disposed in such a manner that the titanium film on a lower layer side comes into contact with the oxide semiconductor film 1.

The optical sensor of Example 3 includes a mechanism that applies the transparent top gate electrode potential 13, which is lower than the source electrode potential 15, to the transparent top gate electrode 12, and a mechanism that applies the drain electrode potential 17, which is higher than the source electrode potential 15, to the drain electrode 16. In addition, the optical sensor of Example 3 has a function of applying the bottom gate electrode potential 19, which is higher than the source electrode potential 15, to the bottom gate electrode 18. The optical sensor configured as described above includes a mechanism that introduces red light into the oxide semiconductor film 1 from the transparent top gate electrode 12 side.

Next, description will be given of a method of manufacturing the optical sensor of Example 3.

First, an aluminum alloy film is formed on the glass substrate 6 in accordance with a sputtering method, and is patterned into a predetermined shape so as to form the bottom gate electrode 18. Then, the second insulating film 4 is formed at a temperature of 350° C. in accordance with a plasma CVD method in such a manner that a silicon nitride film and a silicon oxide film are formed in this order in a total film thickness of 400 nm. Then, an InGaZnO film is formed in a film thickness of 30 nm in accordance with a sputtering method, and is patterned into a desired island shape through etching so as to form the oxide semiconductor film 1. As a composition ratio of the oxide semiconductor film 1, In:Ga:Zn:O=1:1:1:4 can be used.

After forming the oxide semiconductor film 1, an annealing treatment is performed in the air at a temperature of 400° C. for one hour. Then, a silicon oxide film is formed in a film thickness of 100 nm at a temperature of 200° C. in accordance with a plasma CVD method in which a mixed gas of $SiH_4$ and $N_2O$ is used as a raw material, and is patterned into a desired shape so as to form the protective insulating film 22. Then, a three-layer film is formed in the order of titanium film, an aluminum alloy film, and titanium film in accordance with a sputtering method, and is patterned into a desired shape so as to form the source electrode 14 and the drain electrode 16.

Then, the first insulating film 2 (silicon oxide film) is formed in a film thickness of 300 nm at a temperature of 200° C. in accordance with a plasma CVD method in which a mixed gas of $SiH_4$ and $N_2O$ is used as a raw material. After forming the first insulating film 2, an annealing treatment may be performed at a temperature of 300° C. to 400° C. so as to reform the protective insulating film 22 and the first insulating film 2 which are formed at a temperature of 200° C. Then, an ITO film is formed in accordance with a sputtering method, and is patterned into a desired shape so as to form the transparent top gate electrode 12.

In the optical sensor configured as described above, the oxide semiconductor film 1 was irradiated with red light 21 having a wavelength of 700 nm±10 nm from the transparent top gate electrode 12 side. Energy density of the irradiation light is 78 µW/cm². At this time, the transparent top gate electrode potential 13 (Vtg) is set to be lower than the source electrode potential 15 (Vs), and the drain electrode potential 17 (Vd) and the bottom gate electrode potential 19 (Vbg) are set to be higher than the source electrode potential 15 (Vs).

As can be seen from FIG. 4B, in a case where Vtg is set to 0 V or −10 V, a difference between characteristics in a dark state and characteristics in a light irradiation state is small (that is, light sensitivity is very small). However, in a case where Vtg is set to −20 V, when a positive potential is applied to the bottom gate electrode potential 19 (Vbg), a sub-threshold current further increased during irradiation with the red light in comparison to the dark state, and high light sensitivity was achieved.

As described above, the aspect capable of applying the light sensitivity function with respect to the red light (energy of light having a wavelength of 700 nm is approximately 1.8 eV) with energy, which is significantly lower than the band-gap energy (3.0 eV to 3.5 eV) of the oxide semiconductor, to the oxide semiconductor TFT is an important effect of the disclosure which is not possible in the technology of the related art. In addition, measurement as illustrated in FIG. 4B was performed in a temperature range of 20° C. to 80° C., and it could be seen that a current value during irradiation with light hardly varies in comparison to a temperature variation. The small temperature dependency is caused by physical properties of only the oxide semiconductor, and is an important effect of the disclosure. It is possible to utilize the oxide semiconductor TFT as a visible-light sensor over bluish-purple to red by amplifying the light sensitivity of the oxide semiconductor TFT by using the effect.

Example 4

Hereinafter, description will be given of Example 4 related to the optical sensor of the third embodiment. In addition, Example 4 is a modification example of Example 3, and is also a modification example of Example 2 described in the second embodiment.

In Example 2 of the second embodiment and Example 3 of the third embodiment, description has been given of an optical sensor that uses an etch stop type (channel protective type) oxide semiconductor TFT including the protective insulating film 22. A structure of the oxide semiconductor TFT that is used in the optical sensor is not limited to the etch stop type, and may be a so-called channel etch type that does not include the protective insulating film 22. Accordingly, in Example 4, description will be given of an optical sensor that is formed by using the channel etch type oxide semiconductor TFT. In addition, Example 4 has the same configuration as in Example 3 of the third embodiment and Example 2 of the second embodiment except that the protective insulating film 22 is not provided.

Figure 5A:
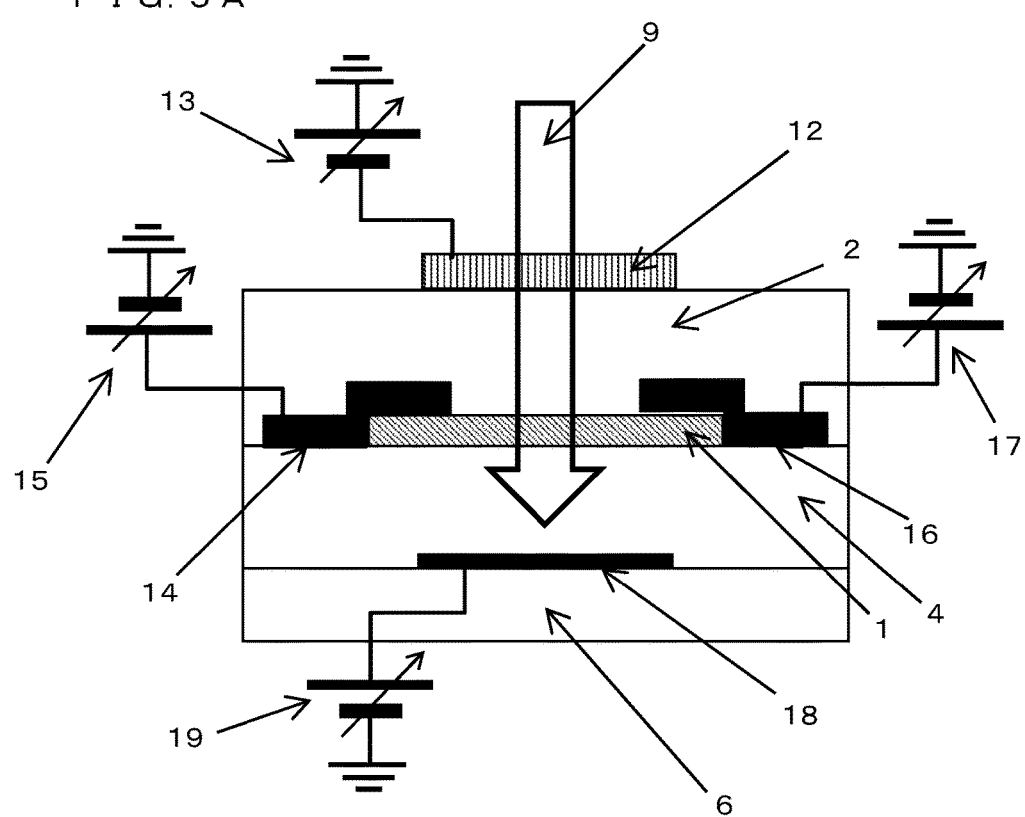
FIG. 5A is a cross-sectional view of an optical sensor according to Example 4 of the third embodiment.

FIG. 5A is a cross-sectional view of the optical sensor according to Example 4 of the third embodiment.

In Example 4, as is the case with Example 2 and Example 3, an InGaZnO film is used as the oxide semiconductor film 1, a silicon oxide film is used as the first insulating film 2, an ITO film is used as the transparent top gate electrode 12, and an electrode formed of an aluminum alloy is used as the bottom gate electrode 18. In addition, as is the case with Example 3, an electrode, in which three layers including a titanium film, an aluminum alloy film, and a titanium film are stacked, is used as the source electrode 14 and the drain electrode 16. In addition, in Example 4, a stacked film, in which a silicon oxide film and an aluminum oxide film are stacked, is used as the second insulating film 4.

In Example 4, a silicon oxide film, which is the first insulating film 2, is formed on an upper side of the InGaZnO film that is the oxide semiconductor film 1, and an ITO film, which is the transparent top gate electrode 12, is further formed on an upper side thereof. In addition, a stacked film which is the second insulating film 4 and in which a silicon oxide film and an aluminum oxide film are stacked, and the bottom gate electrode 18 that is formed of an aluminum alloy are formed on a lower side of the InGaZnO film. The oxide semiconductor film 1 formed as described above is formed on an upper surface of the glass substrate 6 in a state in which the bottom gate electrode 18 is set as a lower side. In addition, the source electrode 14 and the drain electrode 16 are formed in regions which respectively come into contact with the right and left ends of the InGaZnO film (oxide semiconductor film 1).

The optical sensor of Example 4 includes a mechanism that applies the transparent top gate electrode potential 13, which is lower than the source electrode potential 15, to the transparent top gate electrode 12, and a mechanism that applies the drain electrode potential 17, which is higher than the source electrode potential 15, to the drain electrode 16. In addition, the optical sensor of Example 4 has a function of applying the bottom gate electrode potential 19, which is higher than the source electrode potential 15, to the bottom gate electrode 18. The optical sensor configured as described above includes a mechanism that introduces light 9 into the oxide semiconductor film 1 from the transparent top gate electrode 12 side.

Next, description will be given of a method of manufacturing the optical sensor of Example 4.

First, an aluminum alloy film is formed on the glass substrate 6 in accordance with a sputtering method, and is patterned into a predetermined shape so as to form the bottom gate electrode 18. Then, the second insulating film 4 is formed at a temperature of 350° C. in accordance with a plasma CVD method in such a manner that a silicon oxide film and an aluminum oxide film are formed in this order in a total film thickness of 400 nm. Then, an InGaZnO film is formed in a film thickness of 70 nm in accordance with a sputtering method, and is patterned into a desired island shape through etching so as to form the oxide semiconductor film 1. As a composition ratio of the oxide semiconductor film 1, In:Ga:Zn:O=1:1:1:4 can be used.

After forming the oxide semiconductor film 1, an annealing treatment is performed in the air at a temperature of 400° C. for one hour. Then, a three-layer film is formed in the order of titanium film, an aluminum alloy film, and titanium film in accordance with a sputtering method, and is patterned into a desired shape so as to form the source electrode 14 and the drain electrode 16. Then, the first insulating film 2 (silicon oxide film) is formed in a film thickness of 300 nm at a temperature of 250° C. in accordance with a plasma CVD method in which a mixed gas of $SiH_4$ and $N_2O$ is used as a raw material. After forming the first insulating film 2, an annealing treatment may be performed at a temperature of 300° C. to 400° C. so as to reform the first insulating film 2 that is formed at a temperature of 250° C. Then, an ITO film is formed in accordance with a sputtering method, and is patterned into a desired shape so as to form the transparent top gate electrode 12.

Even in the structure that does not include the protective insulating film as illustrated in FIG. 5A, when a potential, which is lower than the source electrode potential 15, is applied to the transparent top gate electrode 12 as the transparent top gate electrode potential 13, it is possible to apply the light sensitivity function as illustrated in FIG. 3B and FIG. 4B to the oxide semiconductor TFT. In a bias state in which the transparent top gate electrode potential 13 (Vtg) is set to be lower than the source electrode potential 15 (Vs), and the drain electrode potential 17 (Vd) and the bottom gate electrode potential 19 (Vbg) are set to be higher than the source electrode potential 15 (Vs), when the oxide semiconductor film 1 is irradiated with the light 9 from the transparent top gate electrode 12 side, a sub-threshold current during irradiation with red light further increased in comparison to a dark state, and high light sensitivity was achieved.

Figure 5B:
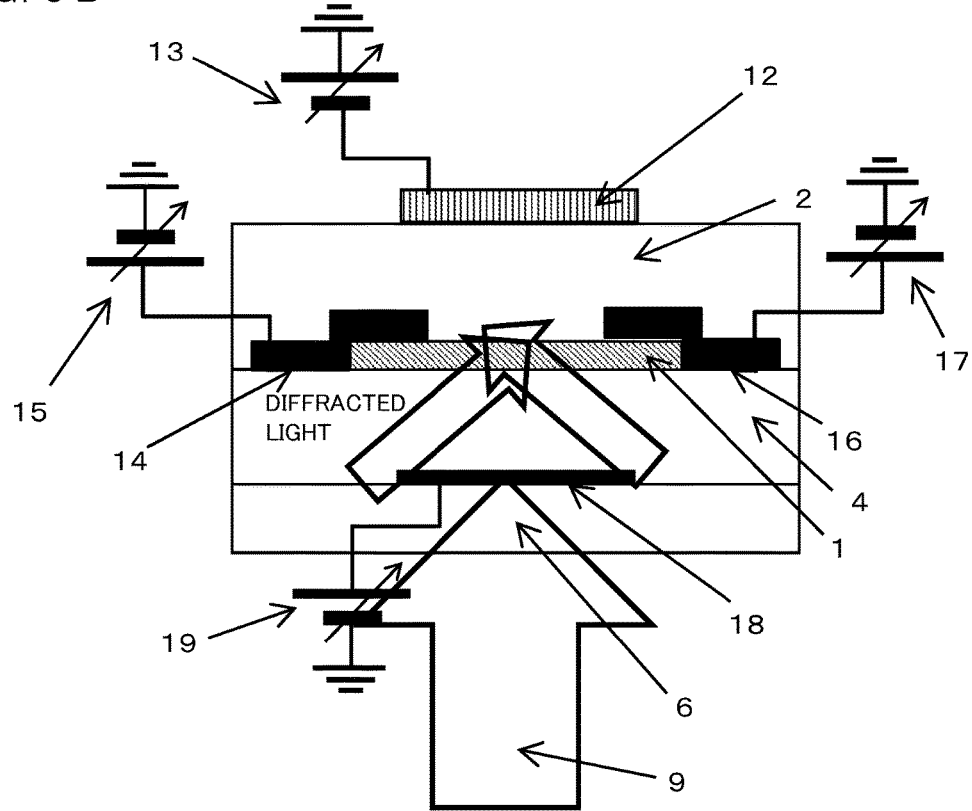
FIG. 5B is a cross-sectional view of an optical sensor according to a modification example of Example 4 of the third embodiment.
Figure 5C:
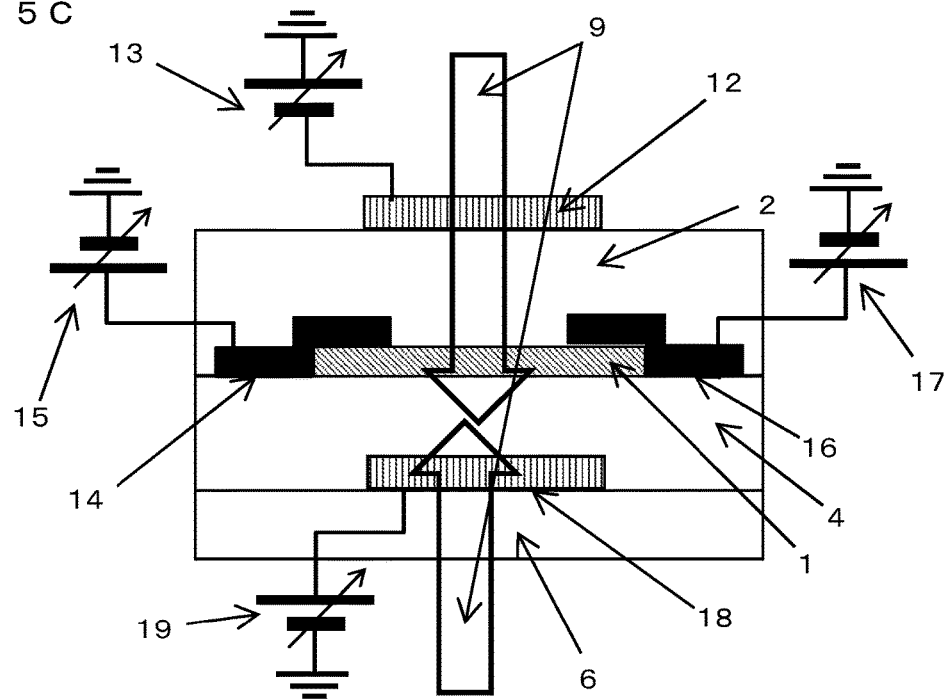
FIG. 5C is a cross-sectional view of an optical sensor according to a modification example of Example 4 of the third embodiment.

FIG. 5B and FIG. 5C are cross-sectional views of an optical sensor according to a modification example of Example 4 of the third embodiment. In an example illustrated in FIG. 5A, irradiation with the light 9 is performed from the transparent top gate electrode 12 side, but as illustrated in FIG. 5B, irradiation with the light 9 can be performed from a side of the bottom gate electrode 18 that is not transparent. In this case, since the bottom gate electrode 18 is not transparent, the light 9 is shielded by the bottom gate electrode 18, but light is introduced to the oxide semiconductor film 1 due to optical diffraction at an edge portion (peripheral portion) of the bottom gate electrode 18. An electron is excited at the inside of the oxide semiconductor film 1 due to the light that is introduced, and according to this, the same light sensitivity as in the case of performing irradiation with the light 9 from the transparent top gate electrode 12 side is obtained, thereby realizing the effect of the disclosure.

In addition, as illustrated in FIG. 5C, both the transparent top gate electrode 12 on an upper side of the oxide semiconductor film 1, and the bottom gate electrode 18 on a lower side of the oxide semiconductor film 1 may be transparent electrodes. In addition, in this case, irradiation with the light 9 can be performed from both the transparent top gate electrode 12 side and the bottom gate electrode 18 side. A configuration, in which irradiation with the light 9 is performed from any one side, is also possible.

Example 5

Hereinafter, description will be given of Example 5 related to the optical sensor of the third embodiment. In addition, Example 5 is a modification example of Examples 3 and 4, and is also a modification example of Example 2 described in the second embodiment.

In Example 2 of the second embodiment and Examples 3 and 4 of the third embodiment, description has been given of a configuration of applying a potential (transparent top gate electrode potential 13), which is lower than the source electrode potential 15, to the transparent top gate electrode 12. A transparent gate electrode can be disposed not only a top side (upper side) but also a bottom side (lower side) of the oxide semiconductor film 1. Accordingly, in Example 5, description will be given of a configuration in which the bottom gate electrode is constituted by a transparent gate electrode, and irradiation with the light 9 is performed from a bottom gate electrode side.

Figure 6:
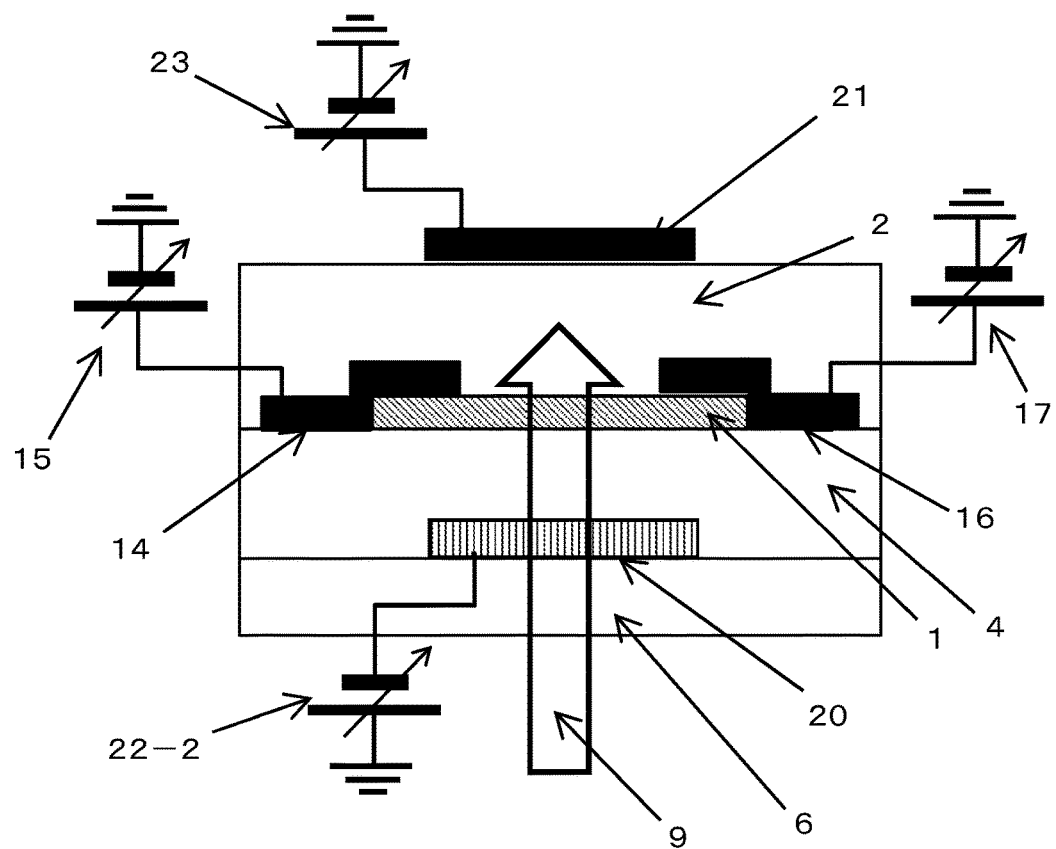
FIG. 6 is a cross-sectional view of an optical sensor according to Example 5 of the third embodiment.

FIG. 6 is a cross-sectional view of the optical sensor according to Example 5 of the third embodiment.

In Example 5, an InGaZnO film is used as the oxide semiconductor film 1, a silicon oxide film is used as the first insulating film 2, a stacked film, in which a silicon oxide film and a silicon nitride film are stacked, is used as the second insulating film 4, and an electrode, in which three layers including a titanium film, an aluminum alloy film, and a titanium film are stacked, is used as the source electrode 14 and the drain electrode 16. In addition, in Example 5, an aluminum and neodymium alloy film is used as a top gate electrode 21, and an InZnO film is used as a transparent bottom gate electrode 20.

In Example 5, a silicon oxide film, which is the first insulating film 2, is formed on an upper side of the InGaZnO film that is the oxide semiconductor film 1, and an aluminum and neodymium alloy film, which is the top gate electrode 21, is further formed on an upper side thereof. In addition, a stacked film which is the second insulating film 4 and in which a silicon oxide film and a silicon nitride film are stacked, and an InZnO film that is the transparent bottom gate electrode 20 are formed on a lower side of the InGaZnO film. The oxide semiconductor film 1 formed as described above is formed on an upper surface of the glass substrate 6 in a state in which the transparent bottom gate electrode 20 is set as a lower side. In addition, the source electrode 14 and the drain electrode 16 are formed on the right and left ends of the InGaZnO film (oxide semiconductor film 1).

The optical sensor of Example 5 includes a mechanism that applies a transparent bottom gate electrode potential 22-2, which is lower than the source electrode potential 15, to the transparent bottom gate electrode 20, and a mechanism that applies the drain electrode potential 17, which is higher than the source electrode potential 15, to the drain electrode 16. In addition, the optical sensor of Example 5 has a function of applying a top gate electrode potential 23, which is higher than the source electrode potential 15, to the top gate electrode 21. The optical sensor configured as described above includes a mechanism that introduces light 9 into the oxide semiconductor film 1 from the transparent bottom gate electrode 20 side.

Next, description will be given of a method of manufacturing the optical sensor of Example 5.

First, an InZnO film is formed on the glass substrate 6 in accordance with a sputtering method, and is patterned into a predetermined shape so as to form the transparent bottom gate electrode 20. Then, the second insulating film 4 is formed at a temperature of 350° C. in accordance with a plasma CVD method in such a manner that a silicon nitride film and a silicon oxide film are formed in this order in a total film thickness of 400 nm. Then, an InGaZnO film is formed in a film thickness of 70 nm in accordance with a sputtering method, and is patterned into a desired island shape through etching so as to form the oxide semiconductor film 1. As a composition ratio of the oxide semiconductor film 1, In:Ga:Zn:O=1:1:1:4 can be used.

After forming the oxide semiconductor film 1, an annealing treatment is performed in the air at a temperature of 400° C. for one hour. Then, a three-layer film is formed in the order of titanium film, an aluminum alloy film, and titanium film in accordance with a sputtering method, and is patterned into a desired shape through plasma etching so as to form the source electrode 14 and the drain electrode 16. Then, the first insulating film 2 (silicon oxide film) is formed in a film thickness of 300 nm at a temperature of 250° C. in accordance with a plasma CVD method in which a mixed gas of $SiH_4$ and $N_2O$ is used as a raw material. After forming the first insulating film 2, an annealing treatment can be performed at a temperature of 300° C. to 400° C. so as to reform the first insulating film 2 that is formed at a temperature of 250° C. Then, an aluminum and neodymium alloy film is formed in accordance with a sputtering method, and is patterned into a desired shape so as to form the top gate electrode 21.

As described above, in a case where a transparent conductive material is used for the bottom gate electrode 20, irradiation with the light 9 can be performed from a glass substrate 6 side. In this case, when the transparent bottom gate electrode potential 22-2, which is lower than the source electrode potential 15, is applied to the transparent bottom gate electrode 20, and the top gate electrode potential 23, which is higher than the source electrode potential 15, is applied to the top gate electrode 21, it is possible to achieve the light sensitivity function as illustrated in FIG. 3B or FIG. 4B.

In Example 4 and Example 5, description has been given of the manufacturing method in which after forming the oxide semiconductor film 1, the source electrode 14 and the drain electrode 16 are formed. However, it is also possible to employ a method in which first, the source electrode 14 and the drain electrode 16 is formed on the second insulating film 4, and then, the oxide semiconductor film 1 is be formed.

Example 6

Hereinafter, description will be given of Example 6 related to the optical sensor of the third embodiment. In addition, Example 6 is a modification example of Examples 3 to 5 of the second embodiment and the third embodiment.

Description has been given of the configuration in which the etch stop type (channel protective type) oxide semiconductor TFT is used for the optical sensor in Example 2 of the second embodiment and Example 3 of the third embodiment, and the channel etch type oxide semiconductor TFT is used for the optical sensor in Examples 4 and 5. A structure of the oxide semiconductor TFT that is used for the optical sensor is not limited thereto, and the following self-align type structure is also possible. In Example 6, description will be given of an optical sensor that uses the self-align type oxide semiconductor TFT.

Figure 7A:
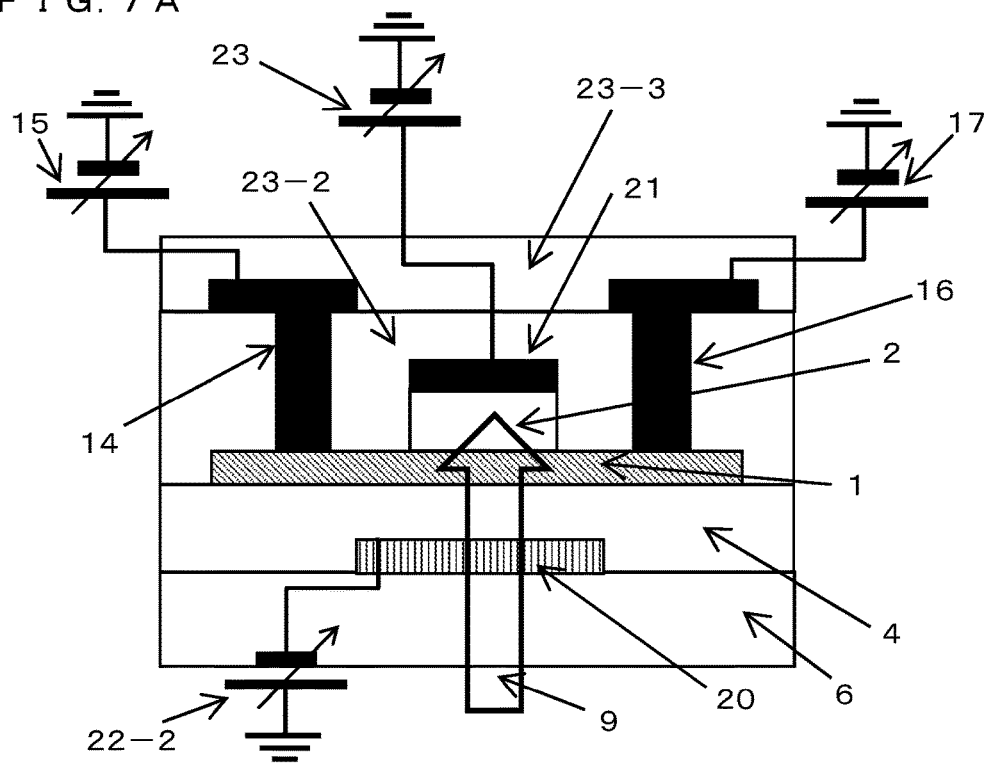
FIGS. 7A and 7B are cross-sectional views of an optical sensor according to Example 6 of the third embodiment.
Figure 7B:
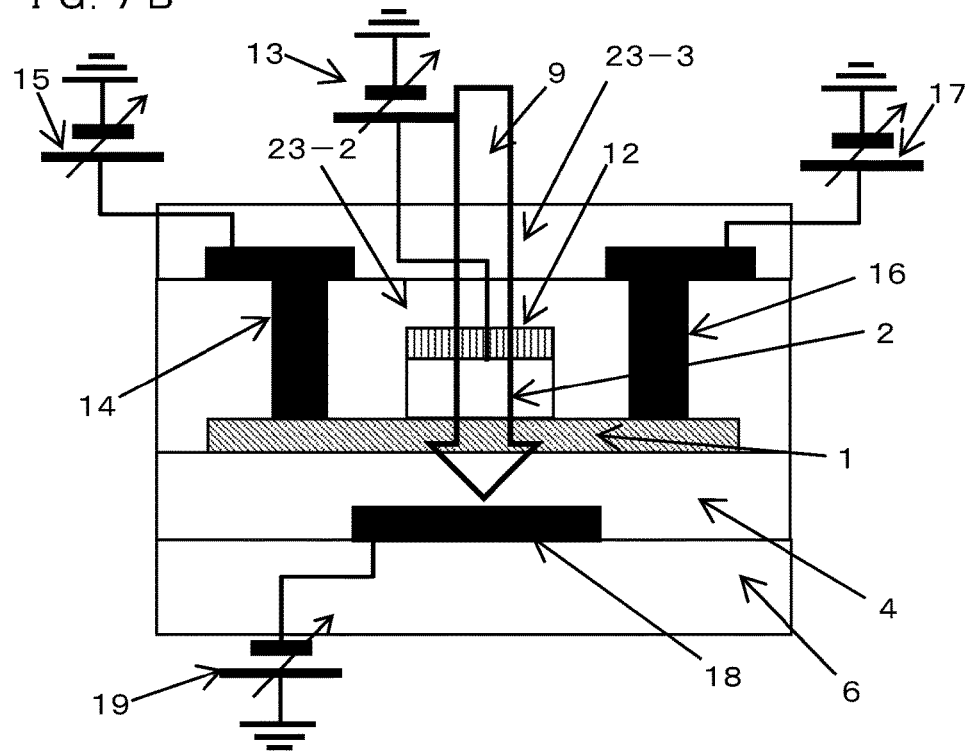

FIGS. 7A and 7B are cross-sectional views of the optical sensor according to Example 6 of the third embodiment.

In Example 6, as illustrated in FIG. 7A, a silicon oxide film, which is the first insulating film 2, is formed on an upper side of an InGaZnO film that is the oxide semiconductor film 1, and an aluminum alloy film, which is the top gate electrode 21, is further formed on an upper side thereof. In addition, the first insulating film 2 (silicon oxide film) and the top gate electrode 21 are formed in the same shape in a self-aligned manner. In addition, a stacked film which is the second insulating film 4 and in which a silicon oxide film and a silicon nitride film are stacked, and an ITO film, which is the transparent bottom gate electrode 20, are formed on a lower side of the InGaZnO film. The oxide semiconductor film 1 formed as described above is formed on an upper surface of the glass substrate 6 in a state in which the transparent bottom gate electrode 20 is set as a lower side. In addition, the source electrode 14 and the drain electrode 16 are formed on the right and left end sides of the InGaZnO film (oxide semiconductor film 1). The source electrode 14 and the drain electrode 16 are formed by using an electrode in which three layers including a titanium film, an aluminum alloy film, and a titanium film are stacked, and are disposed in such a manner that the titanium film on a lower side comes into contact with the oxide semiconductor film 1.

The optical sensor of Example 6 includes a mechanism that applies the transparent bottom gate electrode potential 22-2, which is lower than the source electrode potential 15, to the transparent bottom gate electrode 20, and a mechanism that applies the drain electrode potential 17, which is higher than the source electrode potential 15, to the drain electrode 16. In addition, the optical sensor of Example 6 has a function of applying the top gate electrode potential 23, which is higher than the source electrode potential 15, to the top gate electrode 21. The optical sensor configured as described above includes a mechanism that introduces light 9 into the oxide semiconductor film 1 from the transparent bottom gate electrode 20 side.

Next, description will be given of a method of manufacturing the optical sensor of Example 6.

First, an ITO film is formed on the glass substrate 6 in accordance with a sputtering method, and is patterned into a predetermined shape so as to form the transparent bottom gate electrode 20. Then, the second insulating film 4 is formed at a temperature of 350° C. in accordance with a plasma CVD method in such a manner that a silicon nitride film and a silicon oxide film are formed in this order in a total film thickness of 400 nm. Then, an InGaZnO film is formed in a film thickness of 70 nm in accordance with a sputtering method, and is patterned into a desired island shape through etching so as to form the oxide semiconductor film 1.

After forming the oxide semiconductor film 1, an annealing treatment is performed at a temperature of 450° C. for one hour. Then, the first insulating film 2 (silicon oxide film) is formed in a film thickness of 300 nm at a temperature of 250° C. in accordance with a plasma CVD method in which a mixed gas of $SiH_4$ and $N_2O$ is used as a raw material. After forming the first insulating film 2, an annealing treatment may be performed at a temperature of 300° C. to 400° C. so as to reform the first insulating film 2 that is formed at a temperature of 250° C. Then, an aluminum alloy film is formed in accordance with a sputtering method, and the aluminum alloy film and the silicon oxide film (first insulating film 2) are patterned into a desired shape so as to form a stacked film of the top gate electrode 21 and the first insulating film 2. When etching the first insulating film 2, in an exposed portion of a surface of the InGaZnO film, oxygen vacancy density increases due to a chemical reaction with an etching gas or an etchant, and thus resistivity decreases. Accordingly, this portion functions as a source and drain region.

Then, an interlayer film 23-2 (silicon oxide film) is formed in a film thickness of 300 nm at a temperature of 250° C. in accordance with a plasma CVD method in which a mixed gas of $SiH_4$ and $N_2O$ is used as a raw material. A contact hole is formed at a desired position of the interlayer firm 23-2. Then, a three-layer film is formed in the contact hole in the order of titanium film, an aluminum alloy film, and titanium film in accordance with a sputtering method so as to form the source electrode 14 and the drain electrode 16. In addition, as a passivation film 23-3, a silicon nitride film is formed in a film thickness of 200 nm at a temperature of 250° C. in accordance with a plasma CVD method.

Even in Example 6, as is the case with Examples 1 to 5, when the transparent bottom gate electrode potential 22-2, which is lower than the source electrode potential 15, is applied to the transparent bottom gate electrode 20, and the top gate electrode potential 23, which is higher than the source electrode potential 15, is applied to the top gate electrode 21, it is possible to sense the light 9 that is irradiated from the transparent bottom gate electrode 20 side.

In addition, it is possible to manufacture an optical sensor having a structure, in which a transparent electrode (transparent top gate electrode 12) is disposed on an upper side of the oxide semiconductor film 1 as illustrated in FIG. 7B, in the same manner, and detailed description thereof will not be repeated.

With regard to a structure of a thin film transistor, there is no limitation to the structures illustrated in FIGS. 3A to 7B, and a structure in which the bottom gate electrode 18 is added to a planar type structure that includes the transparent top gate electrode 12, and the like may be employed. As the structure of the thin film transistor, any structure is applicable as long as an insulating film and a gate electrode are respectively provided on both sides of the oxide semiconductor film 1 in an upper and lower direction, a gate electrode on at least one side is formed of a transparent conductive material, and a source electrode and a drain electrode are provided on sides of the oxide semiconductor film 1 in a horizontal direction.

Fourth Embodiment

Figure 8:
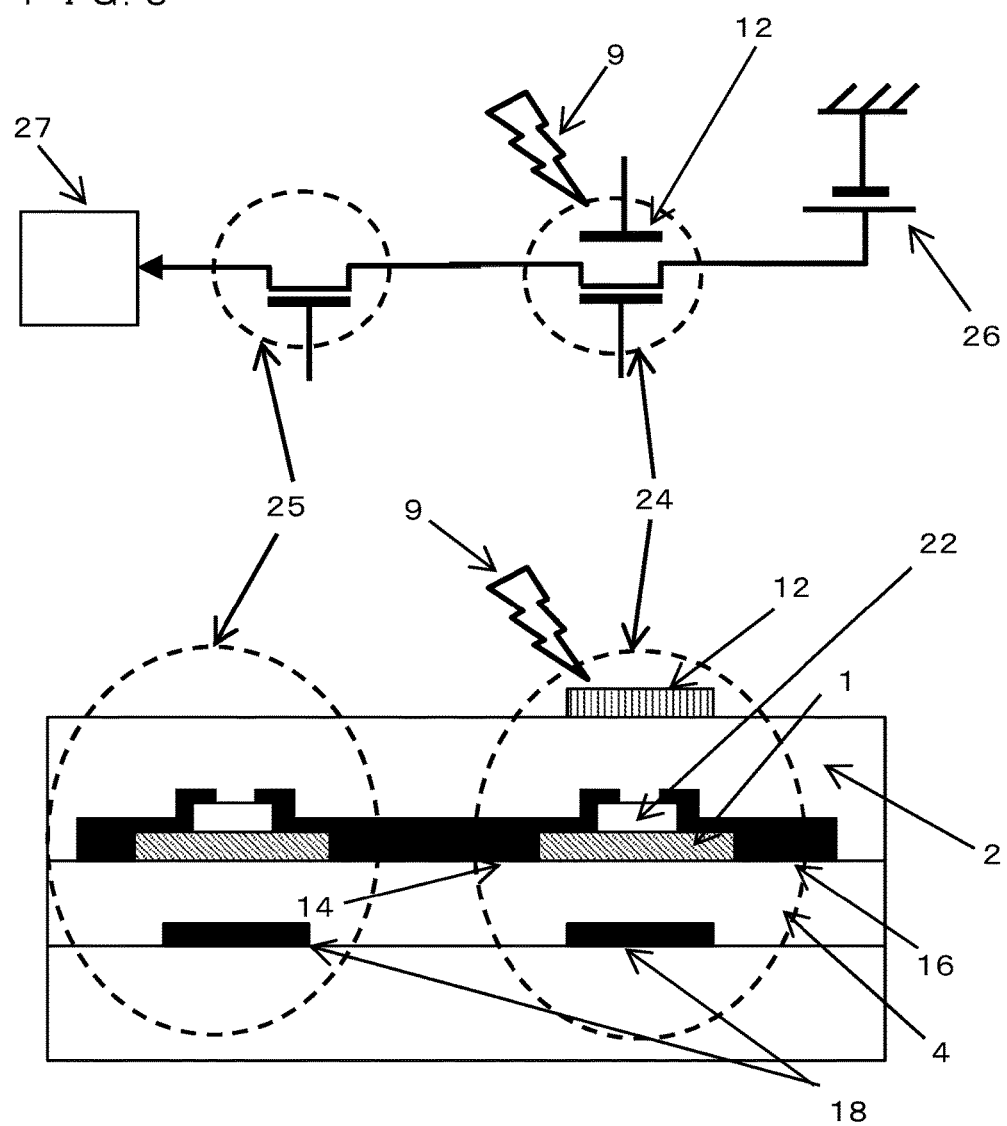
FIG. 8 is a diagram illustrating a photoelectric conversion device according to a fourth embodiment.
Figure 9:
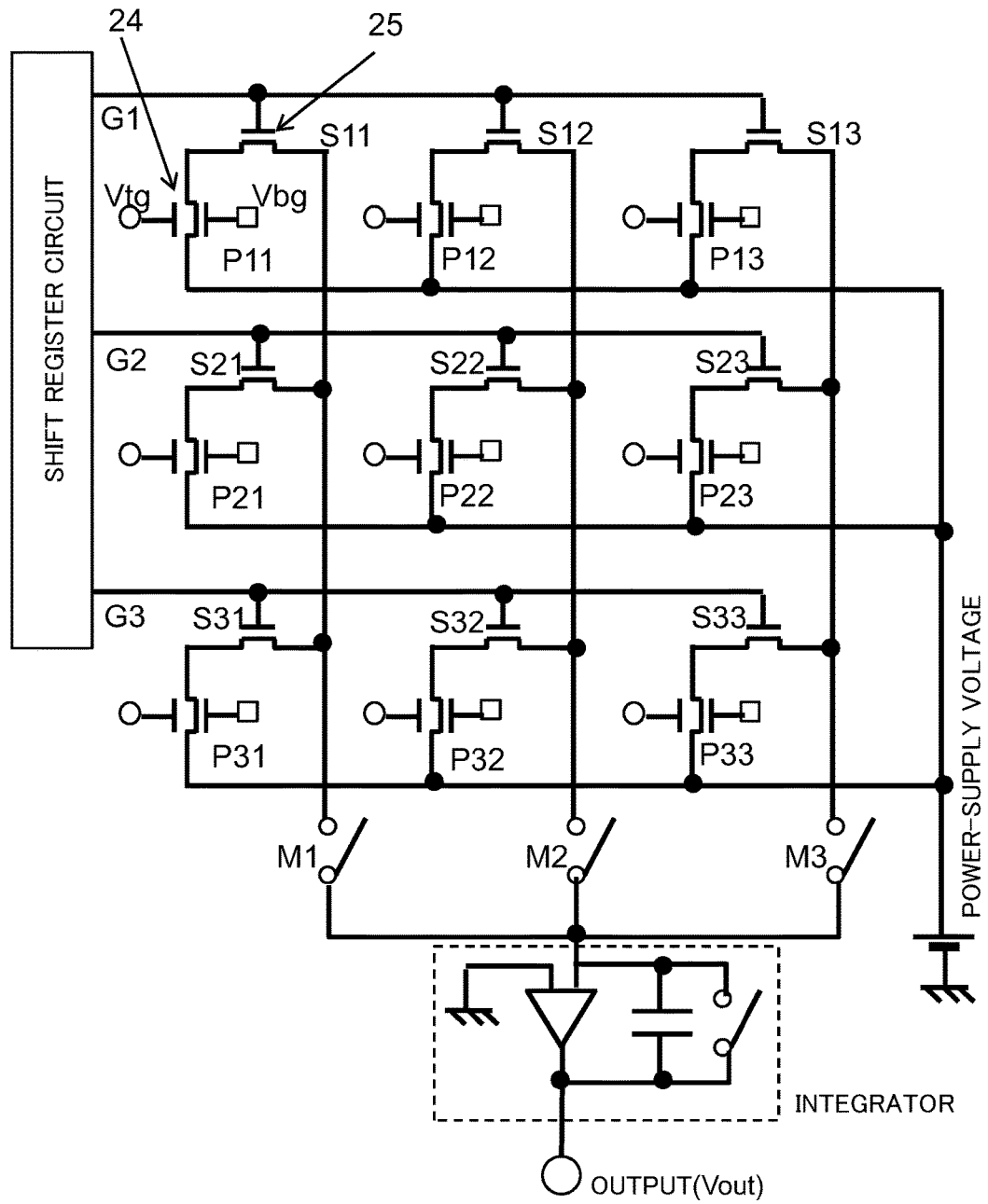
FIG. 9 is a diagram illustrating a photoelectric conversion device according to the fourth embodiment.

FIGS. 8 and 9 are diagrams illustrating a photoelectric conversion device according to a fourth embodiment. FIG. 8 illustrates a photoelectric conversion device for one pixel, and an equivalent circuit and a cross-sectional view are respectively illustrated on an upper side and a lower side in FIG. 8. FIG. 9 illustrates a photoelectric conversion device in which a plurality of pixels, each of which is constituted by an optical sensor element (photoelectric conversion element) 24 and a switching element 25 as illustrated in FIG. 8, are arranged in a two-dimensional matrix shape by using a switching wiring and a signal read-out wiring. In the photoelectric conversion device of the fourth embodiment, all of the optical sensor element 24 and the switching element 25 are constituted by the oxide semiconductor TFT, and the optical sensor element 24 is constituted by the dual gate type oxide semiconductor TFT.

In FIG. 8, the transparent top gate electrode 12, which is transparent with respect to visible light, is provided to the oxide semiconductor TFT that functions as the optical sensor element 24 on a light-receiving surface side thereof. The drain electrode 16 of the oxide semiconductor TFT for the optical sensor element 24 is connected to a predetermined power supply 26, and the source electrode 14 is connected to a source electrode of an oxide semiconductor TFT that functions as the switching element 25. In the oxide semiconductor TFT for the optical sensor element 24, when irradiation with the light 9 is performed from the transparent top gate electrode 12 side, the transparent top gate electrode potential 13 (Vtg), which is lower than the source electrode potential 15 (Vs), is applied to the transparent top gate electrode 12 so as to provide the light sensitivity function.

This configuration utilizes a phenomenon in which when Vtg lower than Vs is applied to the transparent top gate electrode 12, and a positive voltage is applied to the bottom gate electrode 18 on the other side, the amount of visible light absorbed in the oxide semiconductor film 1 (oxide semiconductor active layer) further increases in comparison to a non-voltage application. At this time, the switching element 25 is also irradiated with the light 9, but the oxide semiconductor TFT for the switching element 25 is not provided with the transparent top gate electrode 12. Accordingly, the oxide semiconductor TFT for the switching element 25 does not have the light sensitivity function, and functions as a simple switch without light sensitivity. This configuration is different from Non-Patent Document 1 in which a light shield layer is provided on an upper portion of the oxide semiconductor TFT for the switching element.

During refresh of the photoelectric conversion device, the oxide semiconductor TFT for the switching element 25 is turned ON, and biases, with which both Vbg−|Vtg| and Vs−|Vtg| become negative values, are applied to the oxide semiconductor TFT for the optical sensor element 24 so as to deplete the oxide semiconductor film 1. Then, a charge is charged to the oxide semiconductor TFT for the optical sensor element 24. Then, when the oxide semiconductor TFT for the switching element 25 is turned OFF, and the oxide semiconductor TFT for the optical sensor element 24 is irradiated with the light 9, a charging amount decreases in accordance with the amount of light irradiation. The oxide semiconductor TFT for the switching element 25 is turned ON again, and a charging variation amount is detected by an integrator 27 so as to perform sensing.

As described above, a structure, in which a signal charge due to light irradiation is read out by using a current, is the same as that of the related art. However, when using the oxide semiconductor TFT that includes the transparent top gate electrode 12 as the optical sensor element 24 like the disclosure, the following effect is attained. First, an off-current of the oxide semiconductor TFT is much smaller in comparison to a silicon-based TFT in the related art. Accordingly, an off-current in a dark state becomes much lower in both the switching element 25 and the optical sensor element 24, and thus it is possible to manufacture high-performance photoelectric conversion device in which a signal/noise (S/N) ratio is higher in comparison to the related art. Furthermore, temperature dependency of electrical characteristics of the oxide semiconductor TFT is much smaller in comparison to the silicon-based TFT in the related art. That is, even when a temperature of an ambient environment varies, the electrical characteristics of the oxide semiconductor TFT hardly varies. Accordingly, it is possible to manufacture a photoelectric conversion device which does not depend on a variation in an ambient environmental temperature and is capable of realizing stable performance even under various temperature environments. From the manufacturing viewpoint, the oxide semiconductor TFT for the switching element 25 and the oxide semiconductor TFT for the optical sensor element 24 can be manufactured in the same process, and only a process of adding the transparent top gate electrode 12 to the oxide semiconductor TFT for the optical sensor element 24 increases. Accordingly, it is possible to further reduce manufacturing processes in comparison to the related art, and as a result, a reduction in the cost and a high yield ratio are realized.

FIG. 9 illustrates a configuration of a photoelectric conversion device with 3×3 pixels as an example. In the photoelectric conversion device illustrated in FIG. 9, a gate signal G1 of a shift register circuit is turned ON, and oxide semiconductor TFTs (S11 to S13) for the switching element 25 at a first row from an upper side are turned ON. The bottom gate electrode potential 19 (Vbg) and the transparent top gate electrode potential 13 (Vtg), which are desired, are applied to each of oxide semiconductor TFTs (P11 to P13) for the optical sensor element 24 so as to provide the light sensitivity function to the oxide semiconductor TFTs (P11 to P13) and to charge an optical charge. In addition, the optical charge of each of the oxide semiconductor TFTs (P11 to P13) for the optical sensor element 24 is output to a signal wiring, transmission switches M1 to M3 are sequentially turned ON, and the optical charge of each of the oxide semiconductor TFTs (P11 to P13) for the optical sensor element 24 is read out from the integrator 27 in time series. The above-described processes are repeated in the order of oxide semiconductor TFTs (S21 to S23) for the switching element 25 and oxide semiconductor TFTs (P21 to P23) for the optical sensor element 24 at a second row from an upper side, and oxide semiconductor TFTs (S31 to S33) for the switching element 25, and oxide semiconductor TFTs (P31 to P33) for the optical sensor element 24 at a third row from an upper side so as to two-dimensionally read out the optical charge of respective pixels. According to this, the photoelectric conversion device functions as a two-dimensional photoelectric conversion device.

Example 7

Hereinafter, description will be given of Example 7 related to the photoelectric conversion device of the fourth embodiment.

Figure 10:
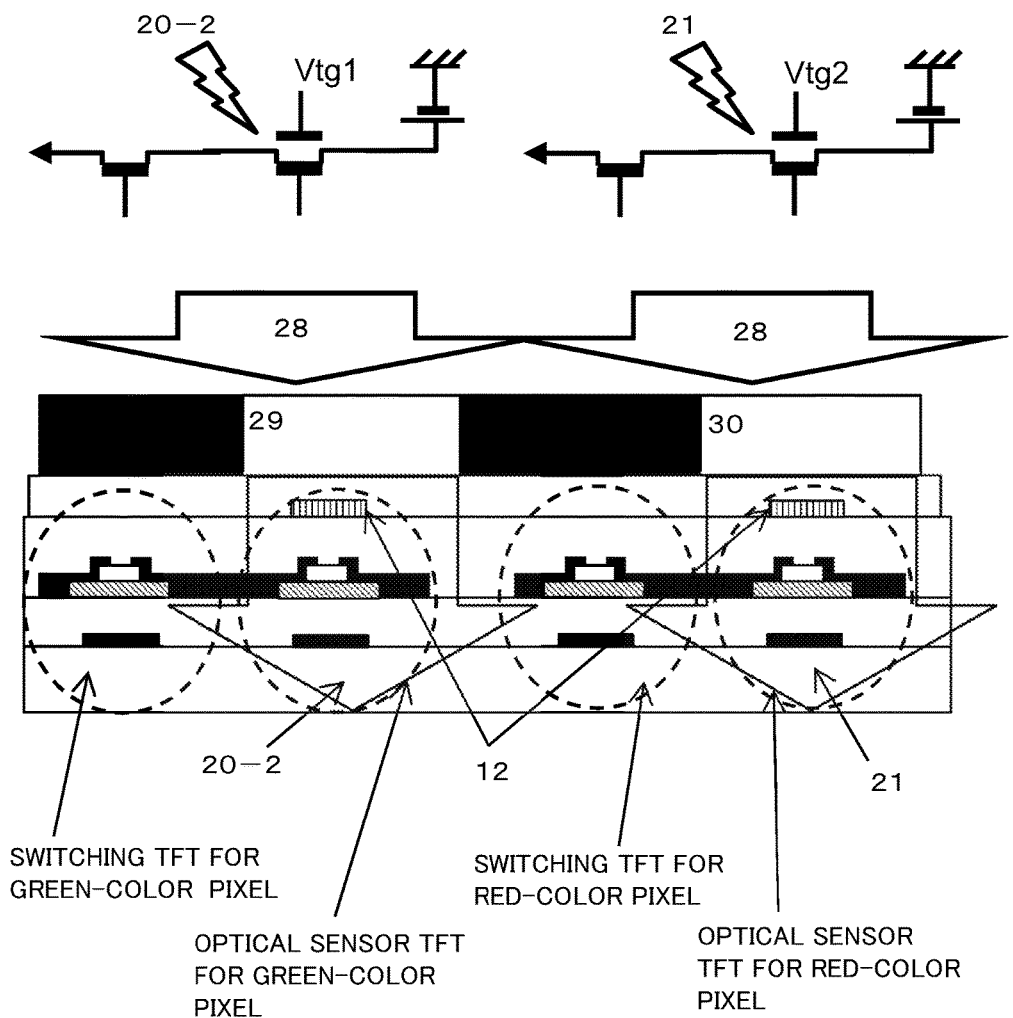
FIG. 10 is a diagram illustrating a photoelectric conversion device of Example 7 of the fourth embodiment.
Figure 11A:
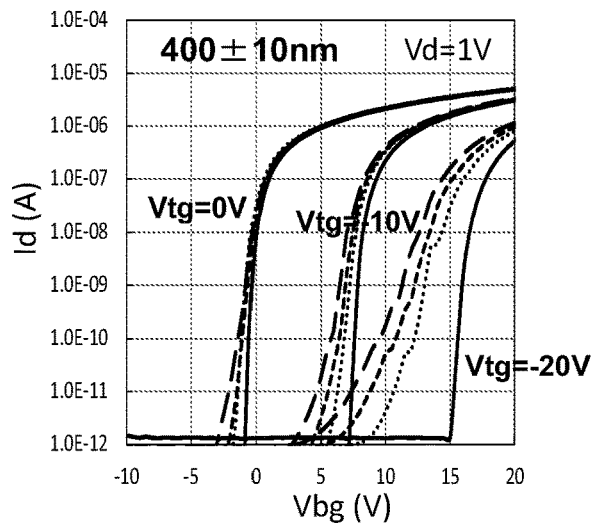
FIGS. 11A to 11C are graphs illustrating optical sensing characteristics of an optical sensor element that is used in the photoelectric conversion device of Example 7 of the fourth embodiment.
Figure 11B:
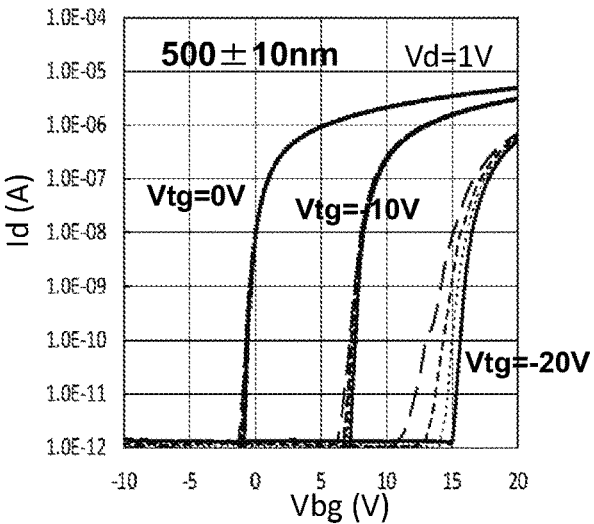
Figure 11C:
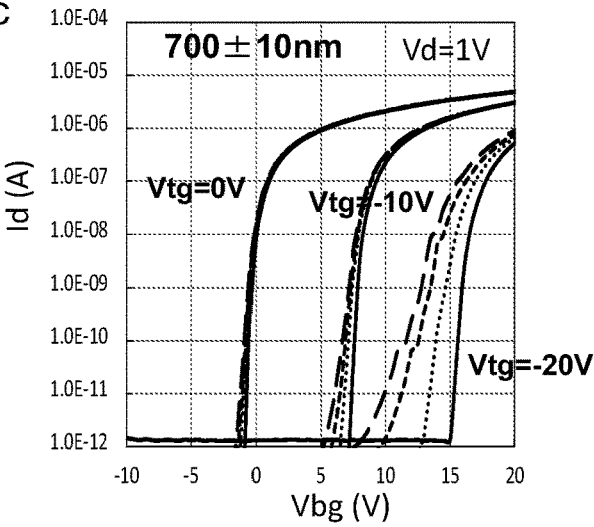

FIG. 10 is a diagram illustrating the photoelectric conversion device of Example 7 of the fourth embodiment. In FIG. 10, an equivalent circuit of the photoelectric conversion device which corresponds to one pixel is illustrated on an upper side, and a cross-sectional view thereof is illustrated on a lower side. FIGS. 11A to 11C are graphs illustrating optical sensing characteristics of an optical sensor element that is used in the photoelectric conversion device of Example 7 of the fourth embodiment. In addition, FIG. 11A illustrates optical sensing characteristics in a case where irradiation with light having a wavelength of 400 nm±10 nm is performed, FIG. 11B illustrates optical sensing characteristics in a case where irradiation with light having a wavelength of 500 nm±10 nm is performed, and FIG. 11C illustrates optical sensing characteristics in a case where irradiation with light having a wavelength of 700 nm±10 nm is performed. In addition, solid lines in FIGS. 11A to 11C represent characteristics in a state in which irradiation with light is not performed (dark state), and respective broken lines in FIGS. 11A to 11C represent characteristics in a state in which irradiation with light having different intensity (energy density) is performed. In addition, with regard to the intensity of the irradiation light, in FIG. 11A, a small broken line is 10.98 $\mu W/cm^2$, an intermediate broken line is 30.06 $\mu W/cm^2$, and a large broken line is 78.03 $\mu W/cm^2$. In addition, in FIG. 11B, a small broken line is 58.67 $\mu W/cm^2$, an intermediate broken line is 104.34 $\mu W/cm^2$, and a large broken line is 175.14 $\mu W/cm^2$. In addition, in FIG. 11C, a small broken line is 78.03 $\mu W/cm^2$, an intermediate broken line is 154.91 $\mu W/cm^2$, and a large broken line is 241.04 $\mu W/cm^2$.

As can be seen from FIGS. 11A to 11C, it is possible to control the light sensitivity of the optical sensor element 24 (oxide semiconductor TFT) by allowing a value of the transparent top gate electrode potential 13 (Vtg) to vary in accordance respective wavelengths. For example, in order to match the light sensitivity at respective wavelengths, with regard to blue having the highest sensitivity, Vtg may be set to −10 V, and with regard to green and red, Vtg may be set to −20 V. As described above, in the disclosure, it is possible to control a value of the transparent top gate electrode potential 13 (Vtg) in accordance with sensitivity with respect to light having each wavelength. In contrast, in an optical sensor that is constituted by a silicon PIN diode in the related art, the light sensitivity with respect to respective wavelengths is uniquely determined with diode characteristics, and thus it is difficult to control the sensitivity for each color.

As illustrated in FIG. 10, there is a photoelectric conversion device in which color filters for three primary colors are provided on a light-receiving surface side for external light 28 (only color filters for red and green are illustrated in FIG. 10). In this case, sensitivity with respect to light of each color can be matched by independently controlling a voltage (Vtg1) that is applied to the transparent top gate electrode 12 of the oxide semiconductor TFT for the optical sensor element 24 that is present at a position to be irradiated with green light 20-2 that is transmitted through a green color filter 29, and a voltage (Vtg2) that is applied to the transparent top gate electrode 12 of the oxide semiconductor TFT for the optical sensor element 24 that is present at a position to be irradiated with red light 21 that is transmitted through a red color filter 30.

For example, in consideration of the characteristics in FIG. 11A to 11C, a transparent top gate electrode potential (Vtg2) of the oxide semiconductor TFT for the optical sensor element 24 that is present at a position of the red color filter 30 can be set to be lower than a transparent top gate electrode potential (Vtg) of the oxide semiconductor TFT for the optical sensor element 24 that is present at a position of the blue color filter. According to this, it is possible to keep balance between sensitivity with respect to blue light and sensitivity with respect to red light by further amplifying sensitivity with respect to red light.

Figure 12:
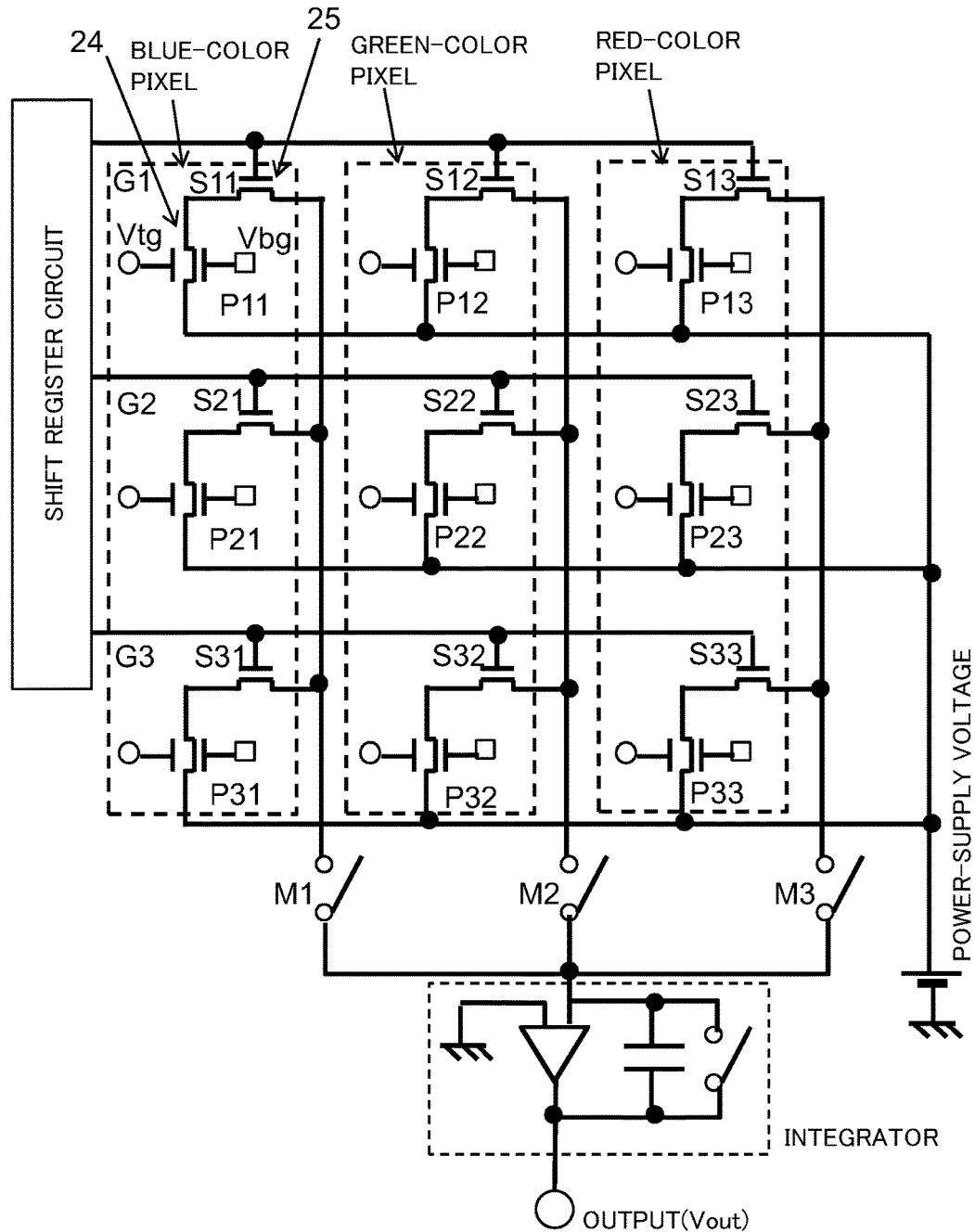
FIG. 12 is a diagram illustrating the photoelectric conversion device of Example 7 of the fourth embodiment.

FIG. 12 is a diagram illustrating the photoelectric conversion device of Example 7 of the fourth embodiment. FIG. 12 illustrates the photoelectric conversion device in which a blue-color pixel, a green-color pixel, and a red-color pixel are arranged. In the photoelectric conversion device illustrated in FIG. 12, a blue color filter, a green color filter, and a red color filter are arranged on a pixel including the switching element 25 and the optical sensor element 24. As illustrated in FIGS. 11A to 11C, light sensitivity of the optical sensor element 24 depends on a wavelength of light and values of the bottom gate electrode potential 19 (Vbg) and the transparent top gate electrode potential 13 (Vtg) in the oxide semiconductor TFT for the optical sensor element 24. Accordingly, it is possible to control light sensitivity at each wavelength band by allowing the values of the bottom gate electrode potential 19 (Vbg) and the transparent top gate electrode potential 13 (Vtg) to vary in accordance with a wavelength band of light to be sensed. Accordingly, the photoelectric conversion device of Example 7 includes a mechanism (voltage control unit) that controls voltages (Vbg and Vtg) which are respectively applied to two gate electrodes in the oxide semiconductor TFT for the optical sensor element 24 in accordance with a wavelength band of light to be sensed.

Referring to FIGS. 11A to 11C, biases of Vtg=−20 V and Vbg=+12 V are necessary in order to obtain a photocurrent (Id) of $1\times10^{-8}$ A in a case where irradiation with blue light (light having a wavelength of 400 nm) at an energy density (intensity) of 78.03 $\mu W/cm^2$ is performed. On the other hand, biases of Vtg=−20 V and Vbg=+15 V are necessary in order to obtain a photocurrent (Id) of $1\times10^{-8}$ A in a case where irradiation with red light (light having a wavelength of 700 nm) at an energy density (intensity) of 78.03 μW/cm$^2$ is performed. That is, in order to obtain the same photocurrent at the same irradiation intensity in different wavelengths of light, a difference between Vtg and Vbg is made to increase with respect to the light having a longer wavelength (in this example, in the case of blue light, the difference is 32 V, and in the case of red light, the difference is 35 V). As described above, when using an operation method in which as a wavelength of light to be sensed becomes longer, a difference between Vtg and Vbg is set to be larger, it is possible to keep valance in sensitivity with respect to various wavelength of light.

Fifth Embodiment

Figure 13:
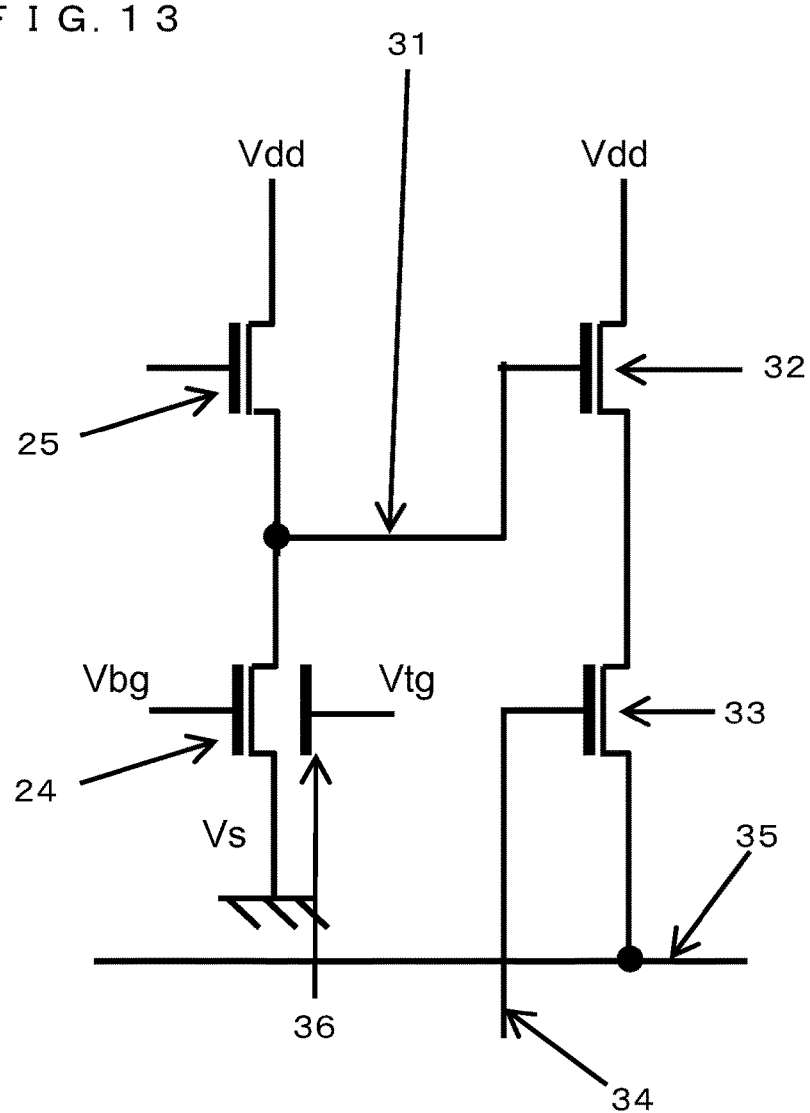
FIG. 13 is a diagram illustrating a photoelectric conversion device according to a fifth embodiment.

FIG. 13 is a diagram illustrating a photoelectric conversion device according to a fifth embodiment. FIG. 13 illustrates an equivalent circuit of the photoelectric conversion device for one pixel that is constituted by the optical sensor element 24 and the switching element 25 as illustrated in FIG. 10. It is possible to constitute a two-dimensional photoelectric conversion device by arranging a plurality of pixels illustrated in FIG. 13 in a two-dimensional matrix shape by using a switching wiring and a signal read-out wiring. In the photoelectric conversion device of the fifth embodiment, both the optical sensor element 24 and the switching element 25 are constituted by the oxide semiconductor TFT, and the optical sensor element 24 is constituted by the dual gate type oxide semiconductor TFT.

In FIG. 13, the oxide semiconductor TFT, which functions as the optical sensor element 24, is provided with a transparent gate electrode 36 on a light-receiving surface side. A source electrode of the oxide semiconductor TFT for the optical sensor element 24 is connected to a ground, and a drain electrode thereof is connected to a source electrode of the oxide semiconductor TFT that functions as the switching element 25. In the oxide semiconductor TFT for the optical sensor element 24, when irradiation with light is performed from the transparent gate electrode 36 side, a light sensitivity function is achieved by applying a transparent gate electrode potential Vtg, which is lower than the source electrode potential Vs (in FIG. 13, a ground potential), to the transparent gate electrode 36. Biases, with which both Vbg−|Vtg| and Vs−|Vtg| become negative values, are applied to the oxide semiconductor TFT for the optical sensor element 24 so as to deplete the oxide semiconductor film 1, and to provide the light sensitivity function to the oxide semiconductor TFT for the optical sensor element 24. Then, a charge is charged to the oxide semiconductor TFT. At this time, the switching element 25 is also irradiated with light, but the oxide semiconductor TFT for the switching element 25 is not provided with the top gate electrode. Accordingly, the oxide semiconductor TFT for the switching element 25 does not have the light sensitivity function, and functions as a simple switch without light sensitivity.

As described above, a signal charge, which is converted into electricity at the oxide semiconductor TFT for the optical sensor element 24 due to the irradiation with light, allows a potential of a floating node 31 on a source end of the oxide semiconductor TFT for the switching element 25 to vary. According to such the potential change, a potential of a gate electrode of an amplification TFT 32, which is connected to the floating node 31, varies, and a potential of a drain node of a read-out TFT 33, which is connected to the amplification TFT 32, varies. At this time, when a selection signal is input to a gate electrode of the read-out TFT 33 through a selection signal input line 34, a potential difference due to a signal charge, which is generated in the optical sensor element 24, is output to a read-out line 35. According to this, sensing is performed.

As described above, a structure, in which the signal charge due to the irradiation with light is read out with the potential difference, is the same as in the related art. However, similar to the disclosure, when using the oxide semiconductor TFT including the transparent gate electrode 36 as the optical sensor element 24, the following effect is attained. First, an off-current of the oxide semiconductor TFT is much smaller in comparison to a silicon-based TFT in the related art. Accordingly, an off-current in a dark state becomes much lower in both the switching element 25 and the optical sensor element 24. And since a signal is read out by the potential difference, it is possible to manufacture high-performance photoelectric conversion device in which a signal/noise (S/N) ratio is much higher in comparison to the related art. Furthermore, temperature dependency of electrical characteristics of the oxide semiconductor TFT is much smaller in comparison to the silicon-based TFT in the related art. That is, even when a temperature of an ambient environment varies, the electrical characteristics of the oxide semiconductor TFT hardly varies. Accordingly, it is possible to manufacture a photoelectric conversion device in which a potential difference signal does not depend on a variation in an ambient environmental temperature and is capable of realizing stable output performance even under various temperature environments. In addition, it is needless to say that the amplification TFT 32 and the read-out TFT 33 are also realized by the oxide semiconductor TFT.

Hereinafter, description will be given of means for further improving the light sensitivity of the optical sensor element 24, and further improving the performance of the photoelectric conversion device.

In FIG. 8, the oxide semiconductor film 1 of the oxide semiconductor TFT that functions as the optical sensor element 24, and an oxide semiconductor film of the oxide semiconductor TFT that functions as the switching element 25 are formed at the same layer. As a result, the film thickness of the respective oxide semiconductor films is the same. The present inventors have found that it is effective to enlarge the film thickness of the oxide semiconductor film 1 of the oxide semiconductor TFT that functions as the optical sensor element 24 in order to further improve the light sensitivity of the optical sensor element 24.

Figure 14A:
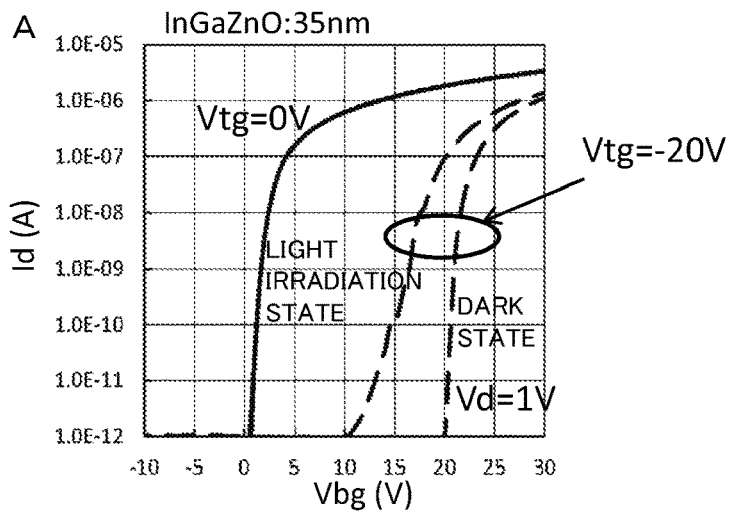
FIGS. 14A to 14C are diagrams illustrating optical sensing characteristics of an optical sensor element.
Figure 14B:
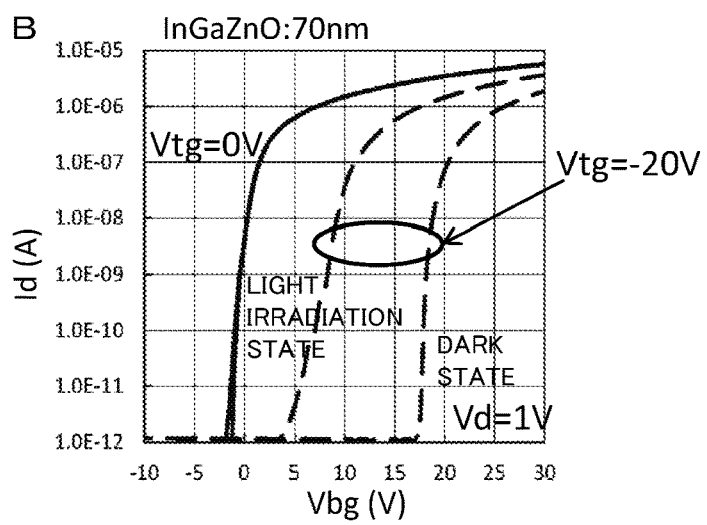
Figure 14C:
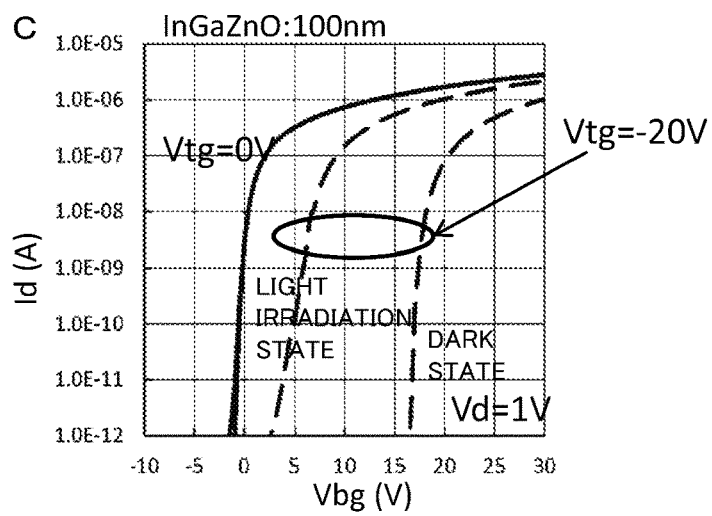

FIGS. 14A to 14C are diagrams illustrating optical sensing characteristics of the optical sensor element 24. FIG. 14A illustrates optical sensing characteristics of the optical sensor element 24 that uses an InGaZnO film having a film thickness of 35 nm as the oxide semiconductor film 1, FIG. 14B illustrates optical sensing characteristics of the optical sensor element 24 that uses an InGaZnO film having a film thickness of 70 nm as the oxide semiconductor film 1, and FIG. 14C illustrates optical sensing characteristics of the optical sensor element 24 that uses an InGaZnO film having a film thickness of 100 nm as the oxide semiconductor film 1. Accordingly, FIGS. 14A to 14C illustrate oxide semiconductor film thickness dependency of the optical sensing characteristics of the optical sensor element 24. Specifically, FIGS. 14A to 14C illustrate characteristics (Vbg-Id characteristics) of a drain current (Id) with respect to the bottom gate electrode potential 19 (Vbg) when the drain electrode potential 17 (Vd) is set to 1 V and the source electrode potential 15 (Vs) is set to 0 V. In addition, solid lines in FIGS. 14A to 14C represent Vbg-Id characteristics in a case where the transparent top gate electrode potential 13 (Vtg) is set to 0 V, and respective broken lines in FIGS. 14A to 14C represent Vbg-Id characteristics in a dark state and a blue light irradiation state in a case where the transparent top gate electrode potential 13 (Vtg) is set to −20 V.

When comparing the characteristics illustrated in FIGS. 14A to 14C, if Vtg is set to −20 V, in the case of 70 nm or 100 nm, it can be seen that a difference between characteristics in a dark state and characteristics in a light irradiation state is greater in comparison to the case of 35 nm. From this result, it can be seen that it is effective to enlarge the film thickness of the InGaZnO film for an improvement in sensitivity, and this configuration is very important for a function of the optical sensor element. In addition, as the film thickness of the InGaZnO film is made to be larger, a Vbg value, at which a drain current suddenly rises, tends to shift to a negative side when Vtg is set to 0 V. This tendency is not preferable as a function of the switching element. In consideration of the above-described situations, the present inventors have found that the film thickness of the oxide semiconductor film 1 of the optical sensor element 24 is preferably thicker, and the thickness of the oxide semiconductor film of the switching element 25 is preferably thinner.

Figure 15A:
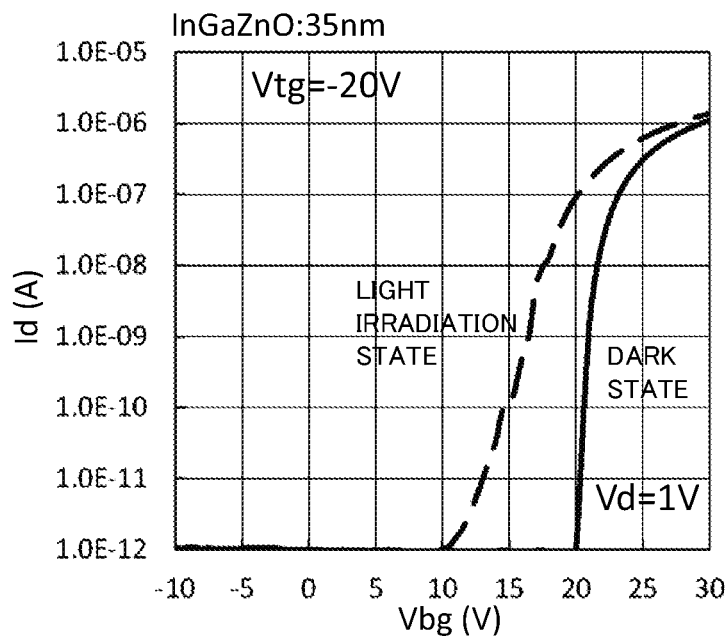
FIGS. 15A and 15B are diagrams illustrating optical sensing characteristics of an optical sensor element.
Figure 15B:
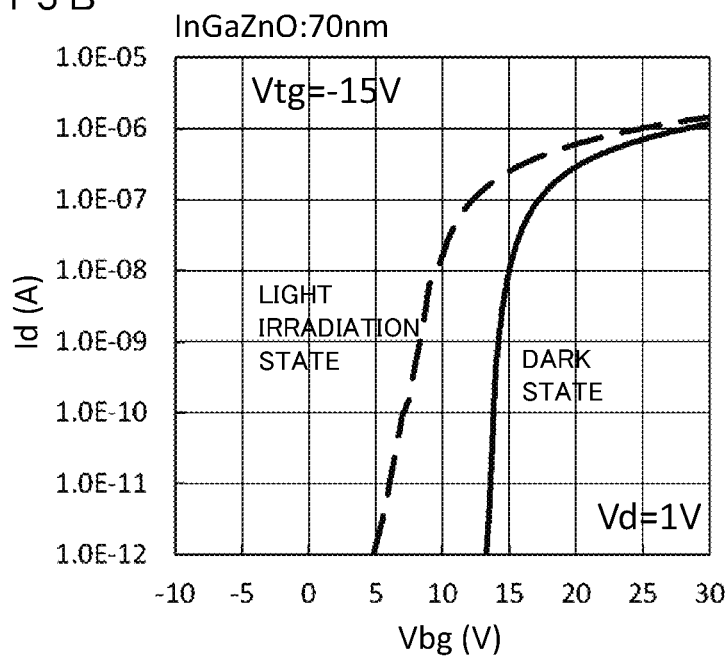

FIGS. 15A and 15B are diagrams illustrating optical sensing characteristics of the optical sensor element 24. FIGS. 15A and 15B illustrate characteristics (Vbg-Id characteristics) of a drain current (Id) with respect to the bottom gate electrode potential 19 (Vbg) when the drain electrode potential 17 (Vd) is set to 1 V and the source electrode potential 15 (Vs) is set to 0 V. In addition, FIG. 15A illustrates characteristics in a case where the transparent top gate electrode potential 13 (Vtg) is set to −20 V in the optical sensor element 24 using an InGaZnO film having a film thickness of 35 nm as the oxide semiconductor film 1. In FIG. 15A, solid lines represent Vbg-Id characteristics in a dark state, and broken lines represent Vbg-Id characteristics in a blue light irradiation state. In addition, FIG. 15B illustrates characteristics in a case where the transparent top gate electrode potential 13 (Vtg) is set to −15 V in the optical sensor element 24 using an InGaZnO film having a film thickness of 70 nm as the oxide semiconductor film 1. In FIG. 15B, solid lines represent Vbg-Id characteristics in a dark state, and broken lines represent Vbg-Id characteristics in a blue light irradiation state.

When comparing the characteristics illustrated in FIGS. 15A and 15B, it can be seen that sensitivity is approximately the same between the case of applying Vtg of −20 V to the optical sensor element 24 that uses the InGaZnO film having a film thickness of 35 nm, and the case of applying Vtg of −15 V to the optical sensor element 24 that uses the InGaZnO film having a film thickness of 70 nm. This represents that it is possible to make an absolute value of Vtg necessary to obtain the same sensitivity small by enlarging the film thickness of the InGaZnO film. When the absolute value of Vtg can be made to be small as described above, it is possible to reduce stress due to Vtg in consideration of long-term use as the optical sensor element, and thus it is possible to realize a long operational lifespan. As described above, the present inventors have found that it is effective to thicken the oxide semiconductor film 1 of the optical sensor element 24 also from the viewpoint of the long operational lifespan of the optical sensor element.

As described above, from the viewpoints of an improvement in sensitivity and an improvement in long-term reliability of the optical sensor element, it is effective to employ a configuration in which the oxide semiconductor film 1 of the optical sensor element 24 is made to be thick, and the oxide semiconductor film of the switching element 25 is made to be thin. Means for realizing this configuration will be described below.

Figure 16:
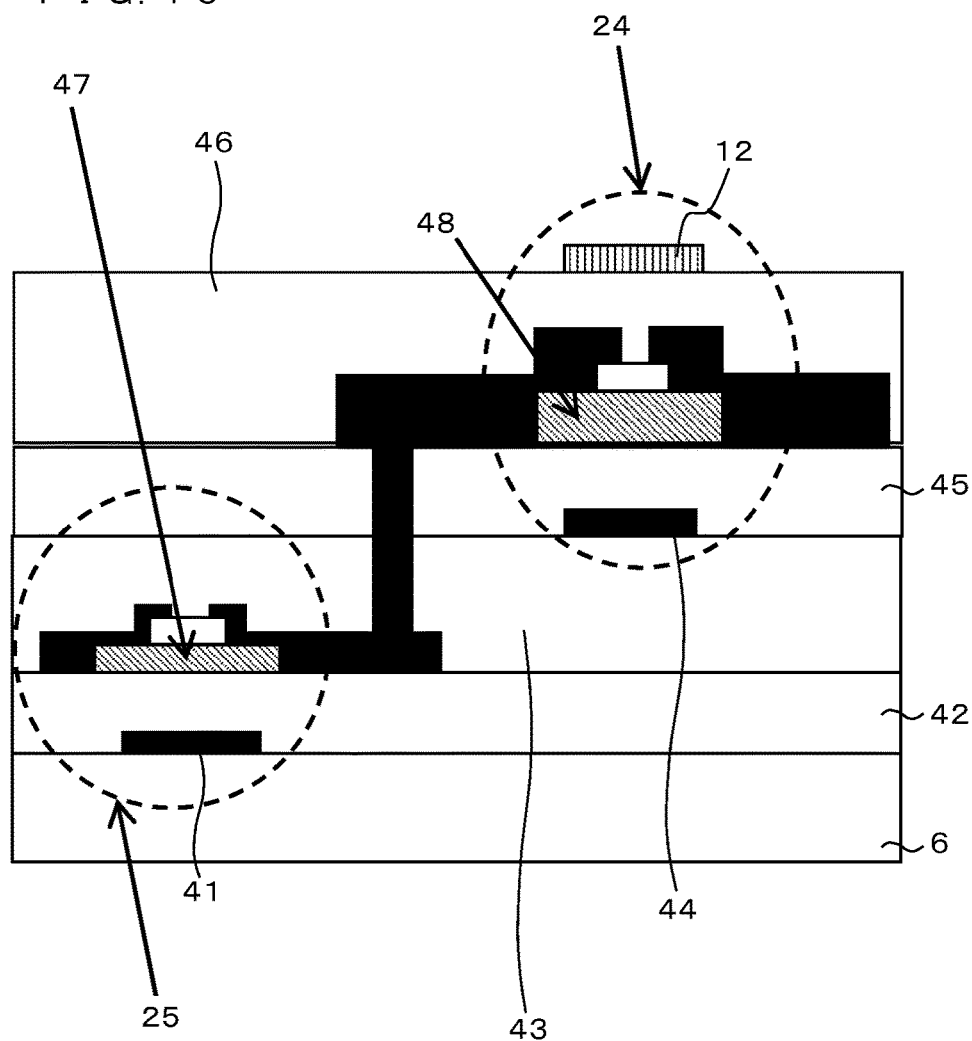
FIG. 16 is a cross-sectional view of a photoelectric conversion device.

FIG. 16 is a cross-sectional view of a photoelectric conversion device. In the photoelectric conversion device illustrated in FIG. 16, the switching element 25 including a thin oxide semiconductor film 47, and the optical sensor element 24 including a thick oxide semiconductor film 48 are formed on the single glass substrate 6.

In the case of manufacturing the photoelectric conversion device illustrated in FIG. 16, after forming a first bottom gate electrode 41 and a first bottom gate insulating film 42 on the glass substrate 6, the oxide semiconductor TFT, which functions as the switching element 25, is formed by using the same process as in the switching element of the fourth embodiment (that is, the process of manufacturing the optical sensor which is illustrated in Examples 1 to 6). At this time, the film thickness of the oxide semiconductor film 47 of the oxide semiconductor TFT is set to be less than 70 nm, and preferably 50 nm or less.

Next, after forming a second bottom gate electrode 44 for the optical sensor element 24 on a first passivation film 43 in the oxide semiconductor TFT for the switching element 25, the oxide semiconductor TFT for the optical sensor element 24 is formed by using the same process as in the switching element 25. At this time, the film thickness of the oxide semiconductor film 48 of the oxide semiconductor TFT is set to 70 nm or greater, and preferably 100 nm or greater. In addition, the transparent top gate electrode 12 for the optical sensor element 24 is formed on a second passivation film 46 in the oxide semiconductor TFT for the optical sensor element 24.

In addition, source and drain electrodes of the oxide semiconductor TFT for the optical sensor element 24 are formed so as to be connected to source and drain electrodes of the oxide semiconductor TFT for the switching element 25 through a contact hole that is formed in the first passivation film 43 and a second bottom gate insulating film 45. In the photoelectric conversion device illustrated in FIG. 16, the source and drain electrodes of the oxide semiconductor TFT for the optical sensor element 24 and the source and drain electrodes of the oxide semiconductor TFT for the switching element 25 are formed in layers different from each other. In this manner, it is possible to individually form the oxide semiconductor TFT for the switching element 25 which includes the thin oxide semiconductor film 47, and the oxide semiconductor TFT for the optical sensor element 24 which includes the thick oxide semiconductor film 48 on the glass substrate 6.

Figure 17:
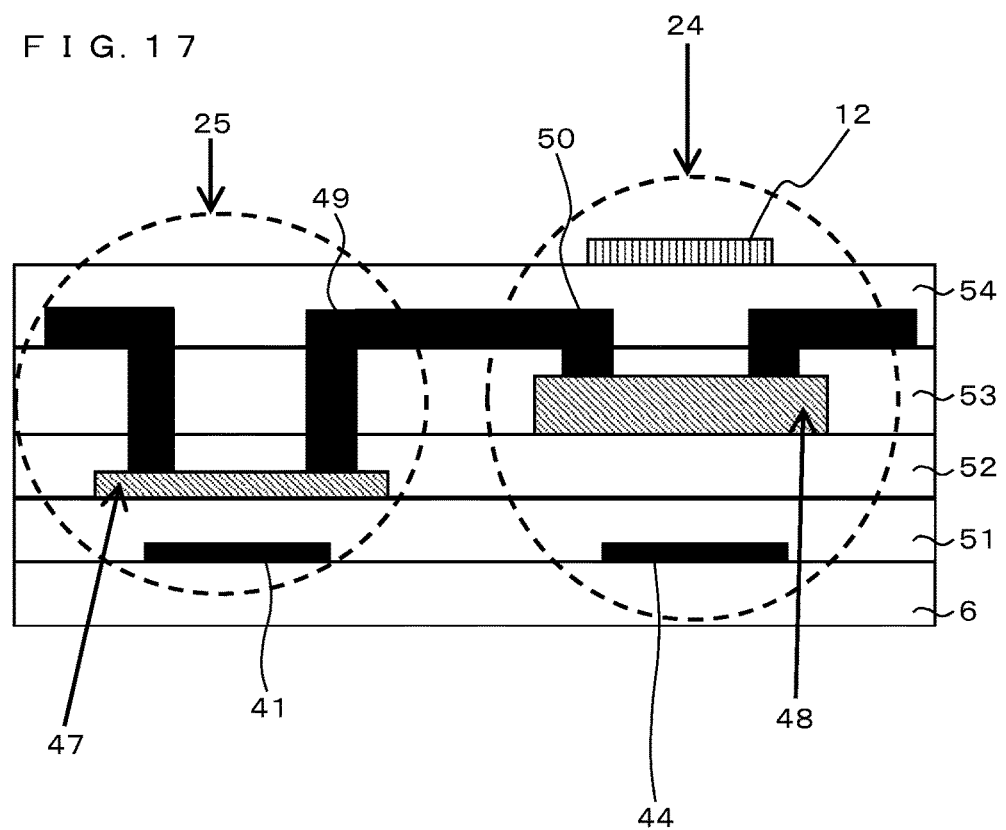
FIG. 17 is a cross-sectional view of a photoelectric conversion device.

FIG. 17 is a cross-sectional view of a photoelectric conversion device. The photoelectric conversion device illustrated in FIG. 17 is a modification example of the photoelectric conversion device illustrated in FIG. 16. In the photoelectric conversion device illustrated in FIG. 17, a bottom gate electrode (first bottom gate electrode 41) of the oxide semiconductor TFT for the switching element 25, and a bottom gate electrode (second bottom gate electrode 44) of the oxide semiconductor TFT for the optical sensor element 24 are formed by the same metal layer. After forming the bottom gate electrodes 41 and 44, a third insulating film 51 is formed as a bottom gate insulating film of the oxide semiconductor TFT for the switching element 25.

Then, a thin oxide semiconductor film 47 is formed as an active layer of the oxide semiconductor TFT for the switching element 25. At this time, the film thickness of the oxide semiconductor film 47 is set to be less than 70 nm, and preferably 50 nm or less.

Then, a fourth insulating film 52 is formed on the third insulating film 51 and the oxide semiconductor film 47, and a thick oxide semiconductor film 48 is formed as an active layer of the oxide semiconductor TFT for the optical sensor element 24. At this time, the film thickness of the oxide semiconductor film 48 is set to 70 nm or greater, and preferably 100 nm or greater. In addition, both the third insulating film 51 and the fourth insulating film 52 function as a bottom gate insulating film of the oxide semiconductor TFT for the optical sensor element 24.

After forming a fifth insulating film 53 on the fourth insulating film 52 and the oxide semiconductor film 48, contact holes for source and drain electrodes are simultaneously opened in both the oxide semiconductor TFT for the switching element 25 and the oxide semiconductor TFT for the optical sensor element 24. In addition, a source electrode 49 and a drain electrode 50 of the respective elements 24 and 25 are formed in such a manner that the source electrode 49 of the switching element 25 and the drain electrode 50 of the optical sensor element 24 are connected to each other through contact holes.

Then, a sixth insulating film 54 is formed, and the transparent top gate electrode 12 of the optical sensor element 24 is formed. Both the fifth insulating film 53 and the sixth insulating film 54 function as a top gate insulating film of the oxide semiconductor TFT for the optical sensor element 24.

When being formed as illustrated in FIG. 17, the bottom gate electrodes 44 and 41, and the source and drain electrodes 49 and 50 of the respective elements 24 and 25 can be formed in the same layer differently from the case of FIG. 16, and thus it is possible to realize simplification of a process, and a reduction in the cost. In this manner, it is possible to individually form the oxide semiconductor TFT for the switching element 25 which includes the thin oxide semiconductor film 47, and the oxide semiconductor TFT for the optical sensor element 24 which includes the thick oxide semiconductor film 48 on the glass substrate 6 at the low cost.

It is needless to say that means for individually forming the oxide semiconductor TFT for the switching element 25 which includes the thin oxide semiconductor film 47, and the oxide semiconductor TFT for the optical sensor element 24 which includes the thick oxide semiconductor film 48 on the glass substrate 6 as illustrated in FIGS. 16 and 17 is also applicable to any one of the photoelectric conversion devices as illustrated in FIGS. 9, 12, and 13. In addition, the process of individually forming the switching element 25 and the optical sensor element 24 which respectively include the oxide semiconductor films 47 and 48 which are different in the film thickness, and the structure of the thin film transistor are not limited to the above-described configurations, and an arbitrary combination of structures among a bottom gate type, a top gate type, a stagger type, and a planer type is also possible.

In all of the above-described embodiments and examples, both the two gate electrodes of the dual gate type oxide semiconductor TFT, which functions as the optical sensor element 24, may be formed of a transparent conductive film. In this case, light can be incident from either side among the two gate electrodes. In addition, it is not necessary for incidence of light to be performed on a side of a gate electrode constituted by a transparent conductive film, and for example, in the case of using diffracted light as illustrated in FIG. 5B, the incidence of light can be performed on a side of a gate electrode that is not transparent.

The optical sensor of the disclosure can be used for an optical sensor or an image sensor that detects light that is received, an image sensor for a radiation image capturing device, and the like. In addition, the optical sensor can be used in a flat panel display such as a liquid crystal display and an organic electroluminescence (EL) display which have a light input function that utilizes optical sensing.

According to the disclosure, in an optical sensor configured by using an oxide semiconductor, a light sensitivity function can be controlled and a light sensitivity over the entirety of a visible light region can be achieved.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

It is noted that, as used herein and in the appended claims, the singular forms "a", "an", and "the" include plural referents unless the context clearly dictates otherwise.

What is claimed is:

1. An optical sensor element comprising:
   a first gate electrode;
   a first insulating film on the first gate electrode;
   an oxide semiconductor active layer which includes a first main surface and a second main surface facing the first main surface, the first main surface including a first to a third area, the second main surface being on the first insulating film;
   a source electrode which electrically connects the first area of the oxide semiconductor active layer;
   a drain electrode which electrically connects the second area of the oxide semiconductor active layer;
   a second insulating film which covers the source electrode, the drain electrode and the third area of the oxide semiconductor active layer;
   a second gate electrode on the second insulating film and above the third area of the oxide semiconductor active layer, a layer of the second gate electrode being different from a layer of the source and the drain electrodes;
   a voltage application unit that applies a first voltage, which is lower than a voltage applied to the source electrode, to one of the first gate electrode and the second gate electrode, and applies a second voltage, which is higher than the voltage applied to the source electrode, to the other of the first gate electrode and the second gate electrode; and
   a detection unit configured to detect intensity of visible light based on a current which flows through the oxide semiconductor active layer.

2. The optical sensor element according to claim 1, wherein at least one of the first and second gate electrodes is transparent with respect to visible light.

3. The optical sensor element according to claim 2, wherein light is incident toward the oxide semiconductor active layer from at least one side of the first and second gate electrodes.

4. The optical sensor element according to claim 1, wherein the first gate electrode is transparent with respect to visible light, and the voltage application unit applies the voltage, which is lower than the voltage applied to the source electrode, to the first gate electrode.

5. The optical sensor element according to claim 4, wherein light is incident toward the oxide semiconductor active layer from the gate electrode side which is transparent with respect to the visible light.

6. The optical sensor element according to claim 1, wherein the second gate electrode is transparent with respect to visible light, and
the voltage application unit applies the voltage, which is lower than the voltage applied to the source electrode, to the second gate electrode.

7. The optical sensor element according to claim 1, wherein a constituent element of the oxide semiconductor active layer includes at least indium or zinc.

8. A photoelectric conversion device comprising:
a plurality of pixels each of which includes an optical sensor element and a switching element and which are two-dimensionally arranged on an insulating substrate by using a switching wiring and a signal read-out wiring,
wherein both the optical sensor element and the switching element are constituted by an oxide semiconductor thin film transistor, and
the optical sensor element is the optical sensor element according to claim 1.

9. The photoelectric conversion device according to claim 8, further comprising:
a voltage control unit that changes the voltage, which is applied to the two gate electrodes of the oxide semiconductor thin film transistor of the optical sensor element by the voltage application unit, in accordance with a wavelength band of light to be sensed.

10. The photoelectric conversion device according to claim 9,
wherein the voltage control unit enlarges a difference between the voltages which are applied to the two gate electrodes by the voltage application unit, as the wavelength of the light to be sensed becomes longer.

11. The photoelectric conversion device according to claim 8,
wherein a film thickness of an oxide semiconductor active layer of the oxide semiconductor thin film transistor that constitutes the optical sensor element is larger than a film thickness of an oxide semiconductor active layer of the oxide semiconductor thin film transistor that constitutes the switching element.

12. The photoelectric conversion device according to claim 11,
wherein the film thickness of the oxide semiconductor active layer of the oxide semiconductor thin film transistor that constitutes the optical sensor element is 70 nm or greater, and the film thickness of the oxide semiconductor active layer of the oxide semiconductor thin film transistor that constitutes the switching element is less than 70 nm.

13. The photoelectric conversion device according to claim 11,
wherein a source electrode and a drain electrode of the oxide semiconductor thin film transistor that constitutes the optical sensor element, and a source electrode and a drain electrode of the oxide semiconductor thin film transistor that constitutes the switching element are respectively constituted by metal layers which are formed at layers different from each other.

14. The photoelectric conversion device according to claim 11,
wherein a source electrode and a drain electrode of the oxide semiconductor thin film transistor that constitutes the optical sensor element, and a source electrode and a drain electrode of the oxide semiconductor thin film transistor that constitutes the switching element are constituted by metal layers which are formed at the same layer.

15. The photoelectric conversion device according to claim 11,
wherein one of the gate electrodes of the oxide semiconductor thin film transistor that constitutes the optical sensor element, and a gate electrode of the oxide semiconductor thin film transistor that constitutes the switching element are constituted by metal layers which are formed at the same layer.

16. The optical sensor element according to claim 1, wherein an area of the second gate electrode is greater than or equal to the area of third area.

17. The optical sensor element according to claim 1, wherein a constituent element of the second gate electrode is different from both a constituent element of the source electrode and a constituent element of the drain electrode.

18. The optical sensor element according to claim 1, wherein the second insulating film is formed on all the third area of the oxide semiconductor active layer.

19. The optical sensor element according to claim 1, further comprising:
a third insulating film on all the third area of the oxide semiconductor active layer,
wherein the second insulating film is formed on the third insulating film.

* * * * *